(12) United States Patent
Nagasawa et al.

(10) Patent No.: US 8,890,170 B2
(45) Date of Patent: Nov. 18, 2014

(54) SILICON CARBIDE SUBSTRATE, SEMICONDUCTOR DEVICE AND METHOD FOR MANUFACTURING SILICON CARBIDE SUBSTRATE

(75) Inventors: Hiroyuki Nagasawa, Inagi (JP); Takamitsu Kawahara, Kawasaki (JP); Kuniaki Yagi, Ome (JP); Naoki Hatta, Hachioji (JP)

(73) Assignee: Hoya Corporation, Tokyo (JP)

( * ) Notice: Subject to any disclaimer, the term of this patent is extended or adjusted under 35 U.S.C. 154(b) by 0 days.

(21) Appl. No.: 13/885,467

(22) PCT Filed: Nov. 15, 2011

(86) PCT No.: PCT/JP2011/076280
§ 371 (c)(1), (2), (4) Date: May 15, 2013

(87) PCT Pub. No.: WO2012/067105
PCT Pub. Date: May 24, 2012

(65) Prior Publication Data
US 2013/0234164 A1    Sep. 12, 2013

(30) Foreign Application Priority Data

Nov. 15, 2010  (JP) .................................. 2010-254530
Sep. 9, 2011   (JP) .................................. 2011-197579

(51) Int. Cl.
| H01L 29/15 | (2006.01) |
| H01L 21/02 | (2006.01) |
| C30B 29/36 | (2006.01) |
| H01L 29/16 | (2006.01) |

(52) U.S. Cl.
CPC .... *H01L 21/02529* (2013.01); *H01L 21/02381* (2013.01); *H01L 21/0265* (2013.01); *C30B 29/36* (2013.01); *H01L 21/0243* (2013.01); *H01L 21/02639* (2013.01); *H01L 21/02447* (2013.01); *H01L 21/02658* (2013.01); *H01L 21/0262* (2013.01); *H01L 29/1608* (2013.01)
USPC .......................................... 257/77; 438/487

(58) Field of Classification Search
USPC ...................................... 257/77, 98; 438/478
See application file for complete search history.

(56) References Cited

U.S. PATENT DOCUMENTS

| 5,279,701 A | 1/1994 | Shigeta et al. |
| 2002/0035960 A1 | 3/2002 | Nakano et al. |

(Continued)

FOREIGN PATENT DOCUMENTS

| JP | B2-6-41400 | 6/1994 |
| JP | A-2000-178740 | 6/2000 |

(Continued)

OTHER PUBLICATIONS

International Preliminary Report on Patentability issued in International Patent Application No. PCT/JP2011/076280 dated May 21, 2013.
International Preliminary Report on Patentability issued in International Patent Application No. PCT/JP2011/076226 dated May 21, 2013.

(Continued)

*Primary Examiner* — Julio J Maldonado
*Assistant Examiner* — Robert Bachner
(74) *Attorney, Agent, or Firm* — Oliff PLC

(57) ABSTRACT

There is provided a silicon carbide substrate composed of silicon carbide, including encapsulated regions inside, which form incoherent boundaries between the silicon carbide and the encapsulated regions, wherein propagation of stacking faults in the silicon carbide is blocked.

9 Claims, 14 Drawing Sheets

(56) References Cited

U.S. PATENT DOCUMENTS

| | | |
|---|---|---|
| 2008/0318359 A1 | 12/2008 | Yonezawa et al. |
| 2010/0199910 A1* | 8/2010 | Watanabe et al. ............... 117/95 |
| 2011/0089431 A1 | 4/2011 | Yagi et al. |

FOREIGN PATENT DOCUMENTS

| | | |
|---|---|---|
| JP | A-2001-257166 | 9/2001 |
| JP | A-2002-201099 | 7/2002 |
| JP | A-2003-176200 | 6/2003 |
| JP | A-2005-350278 | 12/2005 |
| JP | A-2008-94700 | 4/2008 |
| JP | A-2008-311541 | 12/2008 |
| JP | A-2009-12998 | 1/2009 |
| JP | A-2010-184829 | 8/2010 |
| JP | A-2011-84435 | 4/2011 |

OTHER PUBLICATIONS

Shibahara et al., "Antiphase-domain-free growth of cubic SiC on Si(100)," *Appl. Phys. Lett.*, Jun. 29, 1987, pp. 1888-1890, vol. 50, No. 26.

Nagasawa et al., "Heteroepitaxial Growth and Characteristics of 3C-SiC on Large-Diameter Si(001) Substrates," *Materials Science Forum*, 2002, pp. 319-322, vols. 389-393.

Yagi et al., "'Switch-Back Epitaxy' as a Novel Technique for Reducing Stacking Faults in 3C-SiC," *Materials Science Forum*, 2006, pp. 291-294, vols. 527-529.

International Search Report issued in International Patent Application No. PCT/JP2011/076280 dated Jan. 17, 2012.

International Search Report issued in International Patent Application No. PCT/JP2011/076226 dated Jan. 24, 2012.

U.S. Appl. No. 13/885,573, filed May 15, 2013 in the name of Hiroyuki Nagasawa.

* cited by examiner

[110]   [-100]

[001]
[-110] ← ⊗ [110]

(a)

(b)

SILICON CARBIDE SUBSTRATE, SEMICONDUCTOR DEVICE AND METHOD FOR MANUFACTURING SILICON CARBIDE SUBSTRATE

TECHNICAL FIELD

The present invention relates to a silicon carbide substrate used for a high performance semiconductor device. Particularly, there is provided a silicon carbide substrate which has an extremely low planar defects density on a specific crystal surface, and which can be preferably utilized as a material of a power semiconductor device having high efficiency and high breakdown voltage.

DESCRIPTION OF RELATED ART

Silicon carbide has been used as a compound semiconductor material for high performance semiconductor device. However, in some cases, silicon carbide substrate includes high density of crystal defects.

A performance of the semiconductor device is significantly affected by such crystal defects included in the silicon carbide substrate. For example, the representative planar defects, such as an anti-phase boundary and a stacking fault, cause a current leak or dielectric breakdown and remarkably reduce the performance of a power semiconductor device. Therefore, reduction of such planar defects is the main issue for silicon carbide substrate applicable to the device use.

Some conventional methods for reducing the planar defects in silicon carbide substrate will be described hereafter. As a method for reducing the planar defect density during hetero-epitaxial growth of the silicon carbide on a Si substrate, one method for controlling a thickness of the silicon carbide shown in patent document 1, and the other method for using the Si substrate whose surface normal axis is slightly tilted from [001] direction, which is so-called misoriented-Si (001) substrate, shown in non-patent document 1, are given.

By using the misoriented-Si(001) substrate shown in non-patent document 1, the anti-phase boundaries disappear by controlling an orientation of a polar face. Moreover, according to this method, atomic-level steps are introduced at equal intervals in one direction, and therefore propagation of the planar defects in a direction vertical to the introduced steps (in a direction crossing the steps) can be prevented by the step-flow during the silicon carbide hetero-epitaxial growth.

However, it is insufficient to reduce the stacking faults density only by using this misoriented-Si substrate. Essentially, on silicon carbide (001) surface, stacking faults are propagated parallel to four equivalent {111} planes. When two counter-propagated stacking faults are merged during the silicon carbide epitaxial growth, only one of them can be propagated and the other is disappeared. This is so-called an annihilation mechanism between the counter-propagated stacking faults. By repeating this phenomenon, the stacking faults density can be reduced with increasing the silicon carbide growth thickness. However, in a case of the silicon carbide epitaxial growth on the misoriented-Si (001) substrate, the propagation of the stacking faults parallel to (111) plane is preferentially blocked by the steps, and the propagation of the stacking faults parallel to (-1-11) plane becomes dominant. As a result, the effect of annihilation is lost and complete elimination of the stacking faults is not achieved.

In order to effectively reduce both of the planar defects, the anti-phase boundary and the stacking fault with keeping the effect of annihilation, a technique of growing the silicon carbide on the Si (001) substrate on which the undulations are formed parallel with one direction, as shown in patent document 2 and non-patent document 2, is developed. A defects reducing mechanism with using this technique will be described hereafter.

When silicon carbide is grown on the Si substrate on which the undulations are formed parallel with [−110] direction shown in FIG. 9, which is named as the undulant-Si(001) substrate hereafter, the anti-phase boundaries disappear due to the same manner described in the silicon carbide epitaxial growth on the misoriented-Si(001) substrate.

Furthermore, when the silicon carbide is grown on the undulant-Si(001) substrate, the stacking faults density also can be reduced. Essentially, the stacking faults existed on the cubic silicon carbide (001) face are classified into two types by the difference of the polar face exposed on (001) surface. One is a stacking fault exposing a C-polar face on (001) surface and the other is exposing a Si-polar face.

Regarding the stacking fault exposing the C-polar face, its surface energy is relatively lower than that of (001) surface. Therefore, the stacking fault exposing C-polar face is instable on (001) surface and tends to be self-vanished during the silicon carbide epitaxial growth.

Regarding the stacking fault exposing the Si-polar face, on the other hand, its surface energy is relatively higher than that of (001) plane. Therefore, the stacking fault exposing the Si-polar face is relatively stable and tends to be remain on (001) surface. Such stable stacking fault exposing Si-polar face can be reduced by the following manner. FIG. 10 shows an enlarged (−110) cross-sectional image of the undulation formed on a Si(001) substrate. On the facing slopes formed on the undulant substrate 101, the stacking faults 103 keep a mirror symmetrical relation each other. Consequently, stacking faults are continuously annihilated without allowing anisotropy of the propagating direction of the stacking faults described in silicon carbide epitaxial growth on the misoriented-Si(001) substrate.

By using this technique, further reduction of stacking faults than using conventional misoriented-Si(001) substrate should be achieved concerning aforementioned two kinds of stacking faults.

However, when the silicon carbide is hetero-epitaxially grown on the undulant-Si(001) substrate, the stacking faults exposing the Si-polar face are still remained in spite of working the above-mentioned annihilation mechanism. This is because the stacking faults exposing the Si-polar face are continuously occurred due to a lattice strain generated during the crystal growth. During the silicon carbide epitaxial growth, two kinds of the lattice strain are mainly generated. One is caused by a temperature distribution in a substrate, and the other is caused by a lattice miss-matching due to annihilation of the stacking faults. If such strains become larger than the elastic limit strains of the silicon carbide, silicon carbide is plastically deformed to release the strains. This is the occurring mechanism of the strain-induced stacking faults. Namely, new stacking faults are occurred by the existence of such strains, while the stacking faults density is reduced by annihilation process.

In order to reduce the stacking faults exposing the Si-polar face, SBE (Switch-Back-Epitaxy) technique as shown in non-patent document 3 is developed. The SBE technique will be described hereafter.

FIG. 11 shows a lattice model of the staking fault exposing Si- polar face on a surface. As shown in FIG. 11, the stacking fault 112 included in the silicon carbide crystal 111 exposes Si-polar face 113 on a front surface, and C-polar face 114 on a back surface of the substrate. This fact indicates that an exposed surface of the stacking faults can be converted from Si-polar face to C-polar face by turning the substrate upside down. Since the C-polar face is instable and tends to be self-vanished during the crystal growth, the residual stacking faults exposing Si-polar face can be completely eliminated in principle by homoepitaxial growth of the cubic silicon carbide on the back surface of the substrate.

The stacking faults density is actually reduced by using SBE technique, however, complete elimination of the stacking faults is not achieved. This is because the additional stacking faults occurrence during a SBE growth process, which is mainly caused by the strains existing in the cubic silicon carbide substrate and a homo-epitaxial layer. Similarly to the silicon carbide epitaxial growth on the undulant-Si(001) substrate, two kinds of the strains, caused by the temperature distribution in the substrate surface and the lattice miss-matching due to annihilation of the stacking faults, are also generated during SBE growth. Hence, new stacking faults are continuously occurred in the silicon carbide layer to release such strains. Namely, it is quite difficult to fabricate the cubic silicon carbide substrate having extremely low stacking faults density, which is suitable for manufacture of the high performance device, without controlling the lattice strain generated during the crystal growth.

In a technique shown in patent document 3, the undulations are formed not only in one direction but also in a direction orthogonal thereto on Si (001) substrate. By using this technique, a smooth surface is obtained because the surface roughing due to the step-bunching oriented in one direction is avoidable by step-flow growth on the two directional steps formed at the slope of two orthogonal undulations. However, the off-angle is also introduced not only in one direction but also in a direction orthogonal thereto, control of the orientation of the polar-face shown in the aforementioned non-patent document 2 is deteriorated and hence elimination of the anti-phase boundaries is not achieved.

In patent document 4, the defect reducing technique for GaN epilayer is described. Firstly, the trigonal pyramid-like GaN domains are formed by GaN epitaxial growth through the equilateral triangular windows formed on SiO2 masked GaN seed layer on a sapphire substrate. The sides of these triangular windows correspond to three equivalent (11-20) planes. Subsequently, lateral crystal growth is performed on the trigonal pyramid-like GaN domains. Herein, many dislocations are vertically extended from a GaN seed layer to the pyramid-like domains.

By subsequent lateral growth, the dislocations which reach the slope of the pyramid-like GaN domains can be eliminate due to changing their extending direction from vertical to lateral direction. Consequently, reduction of dislocation density in the additional GaN epilayer is achieved. However, when the adjoining pyramid-like GaN domains are merged each other, the dislocations extending to lateral direction are changed their extending direction to vertical again. Consequently, high dislocation density region are formed on the surface of the additional GaN epilayer. Furthermore, the planar defect, such as stacking fault and anti-phase boundaries, propagate in parallel to a specific orientation and their propagation directions are independent of growth direction. Therefore, the propagation direction of the planar defects cannot be controlled through the growth direction.

As described above, even if the technique described in patent document 4 is applied to silicon carbide homoepitaxial growth, it is impossible to obtain the defect-free surface unless the anti-phase boundaries and the stacking faults in the substrate are completely eliminated before homoepitaxial growth.

PRIOR ART DOCUMENT

Patent Document

Patent Document 1:
Examined Patent Publication No. 1994-41400
Patent Document 2:
Japanese Patent Laid Open Publication No. 2000-178740
Patent Document 3:
Japanese Patent Laid Open Publication No. 2002-201099
Patent Document 4:
Japanese Patent Laid Open Publication No. 2001-257166

Non-Patent Document

Non-Patent Document 1:
K. Shibahara, S. Nishino, H. Matsunami, Appl. Phys. Lett. 50 (1987) PP. 1888-1890
Non-Patent Document 2:
H. Nagasawa, T. Kawahara, K. Yagim, Mater. Sci. Forum 389-393 (2002) pp. 319-322
Non-Patent Document 3:
K. Yagi, T. Kawahara, N. Hatta and H. Nagasawa: Mater. Sci. Forum 527-529 (2006) p. 291

SUMMARY OF THE INVENTION

Problem to be Solved by the Invention

In view of the above-described problem, the present invention is provided. The object of the present invention is to provide a silicon carbide substrate with low planar defects density for a high performance semiconductor device use. This object is achieved by reducing planar defects density without allowing anisotropy of propagating direction of the stacking faults, and blocking propagation of the stacking faults caused by a lattice strain during crystal growth.

Means for Solving the Problem

According to the present invention, the following matter is proposed for solving the above-described problem.

According to a first aspect of the present invention, there is provided a silicon carbide substrate having at least stacking faults inside, comprising
encapsulated regions inside of the substrate, forming an incoherent boundaries between the encapsulated regions and silicon carbide,
wherein propagation of the stacking faults in the silicon carbide is blocked at the incoherent boundaries.

According to a second aspect of the present invention, there is provided the silicon carbide substrate of the first aspect, wherein the encapsulated regions include at least one of silicon, carbon, nitrogen, hydrogen, helium, neon, argon, krypton, and xenon.

According to a third aspect of the present invention, there is provided the silicon carbide substrate of the first aspect, wherein the encapsulated regions are hollow.

According to a fourth aspect of the present invention, there is provided the silicon carbide substrate of any one of the first to third aspects, wherein the silicon carbide substrate has two surfaces substantially parallel to each other and having different stacking faults density, and propagation of the stacking faults from one surface with high stacking faults density to the other surface with low stacking faults density, is blocked at the incoherent boundaries between the silicon carbide and the encapsulated regions.

According to a fifth aspect of the present invention, there is provided the silicon carbide substrate of any one of the first to fourth aspects, wherein when a height of the encapsulated region in a direction parallel to a thickness direction of the silicon carbide substrate is represented by H, a width of the encapsulated region is represented by S, center-to-center distance between the adjacent encapsulated regions is represented by P, and an angle formed by the stacking faults and the incoherent boundaries is represented by θ, H≥(P−S)/tan θ is satisfied.

According to a sixth aspect of the present invention, there is provided a silicon carbide substrate having at least stacking faults inside and having at least one or more main surfaces, comprising a plurality of encapsulated regions inside, wherein the plurality of encapsulated regions are distributed substantially in parallel to one of the main surfaces, and propagation of the stacking faults is blocked at the sidewalls being boundaries between the silicon carbide and the encapsulated regions, and when a height of the encapsulated region in a direction parallel to a thickness direction of the silicon carbide substrate is represented by H, a width or the encapsulated region is represented by S, center-to-center distance between the adjacent encapsulated regions is represented by P, and an angle formed by the stacking faults and the incoherent boundaries is represented by θ, H≥(P−S)/tan θ is satisfied.

According to a seventh aspect of the present invention, there is provided the silicon carbide substrate of any one of the first to sixth aspects, wherein the silicon carbide substrate is a cubic silicon carbide with its main surface formed as {001} plane, and the incoherent boundaries are formed in parallel to {110} plane.

According to an eighth aspect of the present invention, there is provided the silicon carbide substrate of any one of the first to sixth aspects, wherein the silicon carbide substrate is a cubic silicon carbide with its main surface formed as {111} plane, and the incoherent boundaries are formed in parallel to any one of {111} plane, {110} plane, or {211} plane.

According to a ninth aspect of the present invention, there is provided the silicon carbide substrate of any one of the first to sixth aspects, wherein the silicon carbide that forms the silicon carbide substrate is a hexagonal silicon carbide with its main surface formed as {0001} plane, and the incoherent boundary are formed in parallel to {11-20} plane or {−1100} plane.

According to a tenth aspect of the present invention, there is provided a semiconductor device formed using the silicon carbide substrate of any one of the first to ninth aspects, wherein a silicon carbide layer having the same crystal structure as a structure of silicon carbide that forms the silicon carbide substrate, is formed on a surface of the silicon carbide substrate, and an internal electric field is formed on the silicon carbide layer.

According to an eleventh aspect of the present invention, there is provided a method for manufacturing a silicon carbide substrate, comprising the steps of forming a plurality of isolated regions having {110} plane as side walls on a silicon carbide substrate with (001) plane as a front surface; and performing homo-epitaxial growth on the silicon carbide substrate, wherein the step of performing homo-epitaxial growth further includes the step of satisfying formula (2) described below:

$$r_{g[001]} \times \tan 35.3° - r_{g[110]} > 0 \quad (2)$$

wherein $r_{g[001]}$ represents a growth rate in [001] direction, and $r_{g[110]}$ represents a growth rate in <110> direction.

According to a twelfth aspect of the present invention, there is provided the method for manufacturing a silicon carbide substrate of the eleventh aspect, comprising the step of laterally growing upper ends of the plurality of isolated regions and bridging them with each other, after the step of performing homo-epitaxial growth on the silicon carbide substrate.

Advantage of the Invention

According to the present invention, there is provided a silicon carbide substrate having a surface with sufficient low defect density for a high performance semiconductor device application by reducing staking faults density with avoiding the anisotropic extension of these stacking faults, and blocking propagation of the additional stacking faults caused by a lattice strain. Specifically, the blocking propagation of the stacking faults is provided by introducing the encapsulated regions, which is made of the material having a discontinuity between itself and the single crystal comprised of the substrate. Since, in principle, a stacking fault can be propagated only within a single crystal, a stacking fault propagation is completely blocked at "the incoherent boundary", which is formed between the above mentioned encapsulated region and the single crystal comprised of the substrate. Therefore, by introducing such encapsulated regions at the favorable position to block the stacking fault propagation, the stacking faults density can be effectively reduced.

Furthermore, by introducing the encapsulated regions inside the substrate, the stacking faults formation caused by the lattice strain generated in a silicon carbide can be suppressed. This is because the encapsulated regions, having the Young modulus smaller than that of the silicon carbide comprised of the substrate, can absorb the lattice strain generated in a silicon carbide.

DETAILED EMBODIMENTS OF THE INVENTION

Embodiments of the present invention will be described hereafter, with reference to the drawings.

Figure 1:
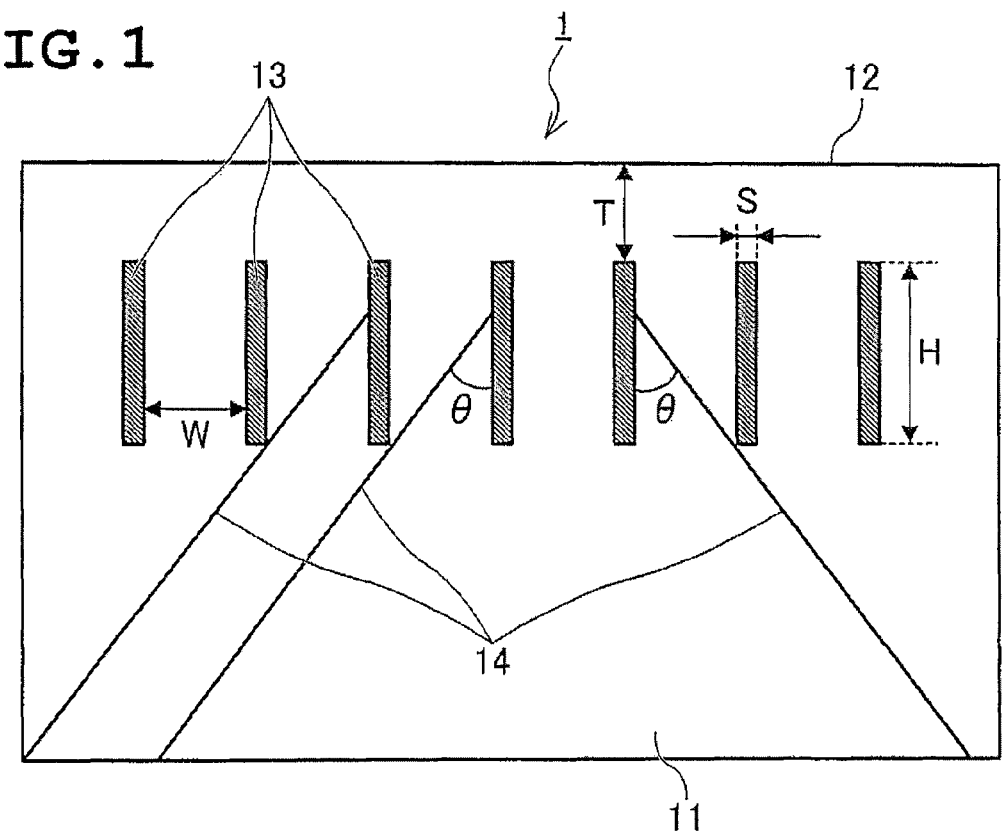
FIG. 1 is a cross-sectional view of a silicon carbide according to the present invention.

FIG. 1 is a cross-sectional view of a silicon carbide substrate 1 according to the present invention. A main surface 12, being a largest portion of the exposed surfaces of the silicon carbide substrate 1, is formed in parallel to (001) face. In addition, the silicon carbide substrate 1 is a plate-shaped crystal with a back surface in parallel to the main surface 12.

A plurality of encapsulated regions 13 exist uniformly within 100 μm, preferably within 50 μm, and further preferably within 20 μm below the main surface 12 of the silicon carbide substrate 1. At the interface between each encapsulated region 13 and the single crystal silicon carbide 11 composed of the silicon carbide substrate 1, a boundary having crystallographic discontinuity between each other, so-called "incoherent boundary", is formed.

The silicon carbide substrate of the present invention is substantially composed of a single crystal silicon carbide. "Substantially" means that this silicon carbide substrate is composed of not only complete single crystal silicon carbide and has the other components, the encapsulated regions with incoherent boundaries and some crystal defects inside thereof. However their volume occupancy to an entire body of the substrate is extremely small, and therefore the silicon carbide substrate of the present invention is composed of substantially the single crystal silicon carbide.

Further, the encapsulated regions 13 may include at least one of the following elements, silicon, carbon, nitrogen, hydrogen, helium, neon, argon, krypton, xenon, otherwise may be a hollow (including a vacuum state). In other words, each encapsulated region 13 is made of one of the single crystal having different crystal orientation of the substrate, polycrystal, amorphous, a material excluding the silicon carbide, and the hollow. Further, a layer in which the encapsulated regions 13 are distributed, is approximately parallel to the main surface 12, and side walls of the encapsulated regions 13 (wall surfaces not approximately parallel to the main surface out of the wall surfaces constituting the encapsulated regions), are approximately parallel to {110} plane.

Wherein, in order to effectively reduce the stacking faults density, it is necessary to satisfy the following geometrical condition that all stacking faults 14 are merged with the encapsulated regions 13. Specifically, as shown in FIG. 1, when an interval between the adjacent encapsulated regions is represented by W, a height of the encapsulated region 13 is represented by H, and an interior angle between the stacking fault 14 and the side wall of the encapsulated region 13 is represented by θ, the following formula (1) should be satisfied.

[Formula 1]

$$H \geq \frac{W}{\tan\theta} \quad \text{Formula (1)}$$

According to the above-described formula (1), the stacking faults density can be effectively reduced if a closest-packed plane to which the stacking faults 14 are propagated and the sidewall of encapsulated regions 13 are not parallel to each other, and the interior angle θ between the stacking faults 14 and the encapsulated regions 13 is larger than 0 degree and less than 90 degrees.

The silicon carbide substrate 1 having the encapsulated regions with satisfying the above-described formula (1) and formula (7) as will be described later, has different stacking faults densities between the main surface 12 and the back surface thereof. The propagation of the stacking faults from back surface to main surface 12 is blocked by the side walls (incoherent boundaries) of the encapsulated regions, therefore the stacking fault density of the main surface 12 should be lower than that of the back surface.

As described above, in the silicon carbide substrate 1, the main surface 12 is parallel to (001) face, and the side walls of the encapsulated region 13 are approximately parallel to {110} planes. On the other hand, the stacking faults 14 included in the cubic silicon carbide 11 are propagated in parallel to {111} planes corresponding to the closest-packed plane. Therefore, the interior angle θ between the stacking faults 14 and the encapsulated regions 13 will be 35.3 degrees.

Wherein, each of the dimensions concerning the encapsulated region 13, such as its interval W, its height H, and its width in the parallel direction to the main surface, represented by S, is desirable to be satisfy the following conditions, respectively. As for the interval W, it is desirable to be 100 nm or more and 100 μm or less, preferably 1 μm or more and 50 μm or less, and further preferably 2 μm or more and 20 μm or less in length. This is because when interval W is extremely small, processing of formation of the encapsulated regions 13 becomes to be difficult. Furthermore, a substrate resistance increases due to increasing of the volume occupancy of the encapsulated regions 13 in the substrate. When interval W is extremely large, the height H is also required to be extremely large value to satisfy the formula (1). Consequently, the thermal strain can't be completely absorbed due to decreasing of the volume occupancy of the encapsulated regions 13 in the substrate.

As for the height H, its value is given by the interval W and formula (1). When the height H is extremely small, processing of formation of the encapsulated regions 13 becomes difficult because the extremely small value of the interval W is required to satisfy the formula (1). Furthermore, the thermal strain can't be completely absorbed due to decreasing of the volume occupancy of the encapsulated regions 13 in the substrate. When the height H is extremely large (for example, when height H is 100 μm or more), processing of formation of the encapsulated regions 13 becomes difficult. Furthermore, a substrate resistance increases due to increasing of the volume occupancy of the encapsulated regions 13 in the substrate.

As for the width S, when the width S is extremely small, processing of formation of the encapsulated regions 13 becomes difficult. Furthermore, the thermal strain can't be completely absorbed due to decreasing of the volume occupancy of the encapsulated regions 13 in the substrate. When the width S is extremely large, a substrate resistance increases due to increasing of the volume occupancy of the encapsulated regions 13 in the substrate. Furthermore, it becomes difficult to form the encapsulated regions 13 with satisfying the desired values of the interval W. Therefore, the width S is also desirable to be 100 nm or more and 100 μm or less, preferably 1 μm or more and 50 μm or less, and further preferably 2 μm or more and 20 μm or less in length.

In addition to the above described dimensions of the encapsulated regions 13, a depth from the main surface 12 to the encapsulated regions 13 (distance from the main surface to top of the encapsulated region 13), represented by T, also has desired value. When the depth T is extremely small, top layers of cubic silicon carbide covered on the encapsulated regions 13 become extremely thin. Consequently, the encapsulated regions 13 are possibly exposed on the main surface 12 due to the damage of the top layer caused by their poor mechanical strength. Furthermore, when an activating region of semiconductor device is formed on the extremely thin top layer on the encapsulated regions 13, a uniform current flow through the substrate may be disturbed and it can cause local overheat or breakdown. Meanwhile, when the depth T is extremely large, the thermal strain of the layer between the encapsulated regions 13 and the main surface 12 can't be absorbed effectively. Consequently, reduction of the stacking faults density on the main surface 12. is not achieved. Therefore, depth T is desirable to be 100 nm or more and 100 μm or less, preferably 1 μm or more and 50 μm or less, and further preferably 10 μm or more and 30 μm or less in depth.

Considering the above description, the height H is desirable to be five times or more larger than the width S and the plane area of the encapsulated region 13 parallel to the main surface 12 is desirable to be ⅒ or less of the entire area of the main surface 12.

Since the side wall, being a part of the encapsulated region, takes a major role for reducing stacking faults density, whole shape of the encapsulated regions has a lot of flexibility in the design as long as satisfying the aforementioned condition for the side wall and each dimension indicated in FIG. 1. For example, as for the encapsulated regions having a cross-sectional structure shown in FIG. 1, both of a line-space structure and a mesa structure are applicable, furthermore, each encapsulated region may also be connected inside the substrate without isolation.

A detailed method for fabricating the aforementioned silicon carbide substrate 1 will be described using first to third embodiments as will be described later, but an outline thereof will be described here.

Undulation slopes parallel in [−110] direction are formed on Si(001) substrate as shown in the aforementioned patent document 2 and non-patent document 2. A maximum angle of this slope is desirable to be 2 degrees or more and 90 degrees or less. This is because, when the maximum angle is less than 2 degrees, an area of the polar face exposed at the edge of atomic steps becomes negligibly small compared with the area of non-polar (001) surface. Consequently, the defect reducing mechanism for anti-phase boundaries described in the silicon carbide epitaxial growth on the misoriented-Si (001) substrate does not work well. Meanwhile, when the maximum angle exceeds 90 degrees, the step-flow epitaxial growth is inhibited on the reverse tapered slopes.

These slopes of the adjacent undulations are continuously connected like a sinusoidal wave. Namely, the inclination angles of bottom and top of the undulations are 0 degree, and the inclination angle of the slope between bottom and top of the undulation is continuously varied from 0 degree to the maximum angle.

The cubic silicon carbide is grown on the aforementioned substrate. Although CVD, MBE, and LPE, etc., are available for cubic silicon carbide growth, the flow rate of Si-source and C-source are desired to be individually adjustable in any case. Furthermore, supply ratios of the Si-source and C-source are preferably adjustable by precisely adjusting gas flow rates. When the growth rates are differentiated between Si-polar face and C-polar face by suitably adjusting the supply ratios of the Si-source and C-source, a specific crystal face is oriented in a specific orientation. In the case of Si-polar face, it is oriented to (111) plane or (−1-11) plane, and the C-polar face oriented to (−111) plane or (1-11) plane. Thus, by controlling the orientation of the polar face, the anti-phase boundary can be eliminated. The stacking faults, on the other hand, are remained on the substrate. All of them are distributed in {111} planes, corresponding to the closest-packed plane, and intersect with the main surface (001) surface at an angle of 54.7 degrees.

When the encapsulated regions having side walls in approximately parallel to {110} plane are formed on the silicon carbide substrate with the aforementioned structure, incoherent boundaries are formed as the boundaries between the encapsulated regions and the silicon carbide. The propagation of the stacking faults in the silicon carbide can be blocked by these incoherent boundaries.

<First Embodiment>

The silicon carbide substrate according to a first embodiment of the present invention will be described hereafter.

According to the first embodiment, the stacking faults density on the main surface 12 can be reduced by executing a manufacturing procedure of (I) to (III) shown below.

(I) Formation of isolated regions (II) Reduction of the stacking faults density by homo-epitaxial growth (III) Expansion of a low stacking faults region by bridging the isolated regions (I) to (III) will be described hereafter in detail.

(I) Formation of the Isolated Regions

Figure 12:
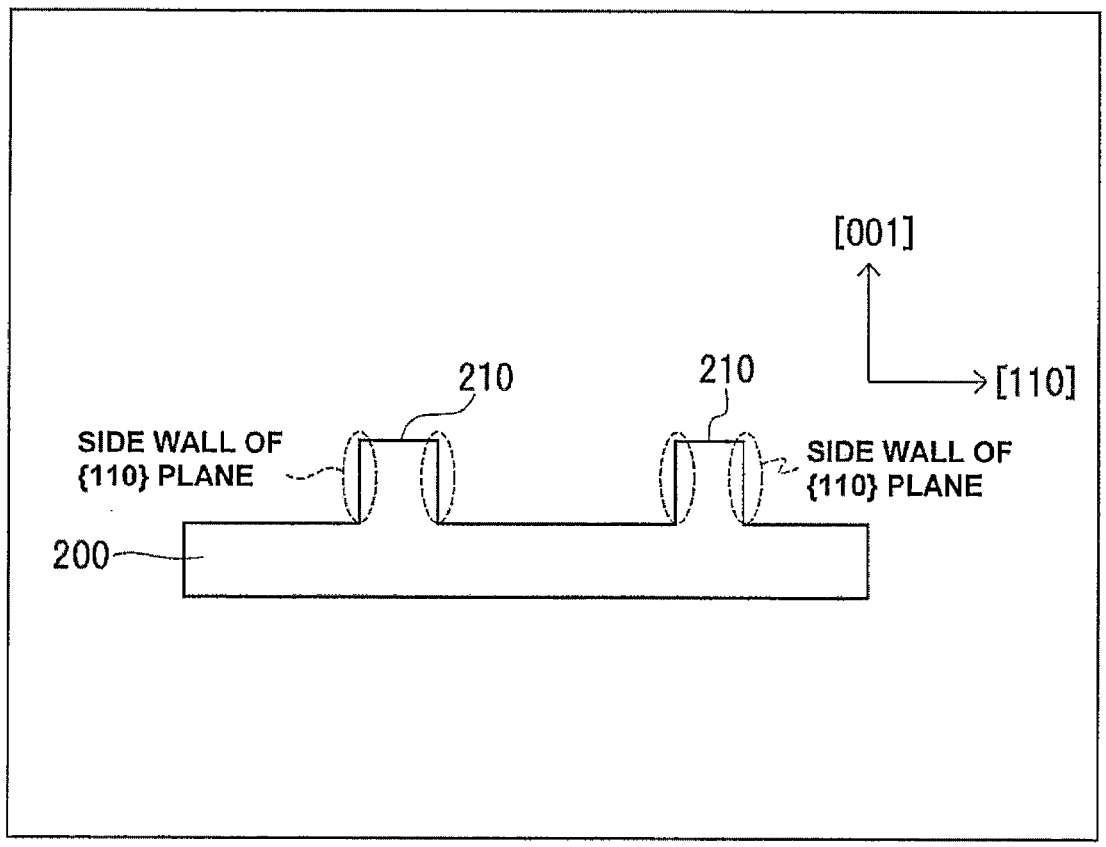
FIG. 12 is a view for describing a mechanism of reducing a stacking faults density.

First, as shown in FIG. 12, salient portions (called isolated regions 210 hereafter) having side walls of {110} planes are formed on (001) surface of the substrate made of 3C—SiC (simply called a SiC substrate 200 hereafter). Each isolated region 210 may have a so-called line-space structure or mesa-structure. As a condition, as described above, extremely preferably the isolated region 210 has a side wall of {110} plane. Such isolated regions 210 can be formed by etching or homo-epitaxial growth on the patterned surface of the SiC substrate 200.

Figure 14:
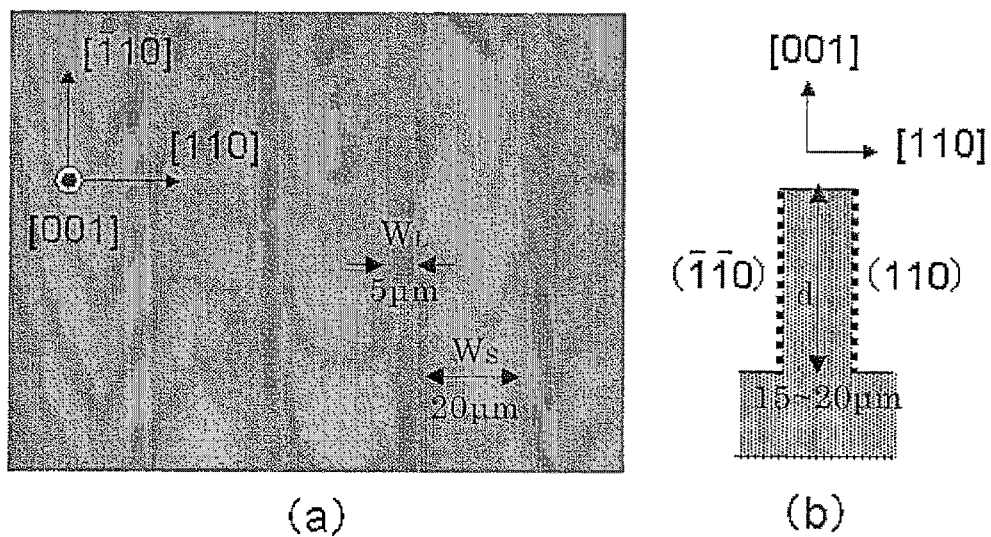
FIG. 14(a) shows a plane view of isolated regions in a line-space structure observed by an optical microscope.
FIG. 14(b) is a view showing a cross-sectional surface of an isolated region of a line-space structure.

FIG. 14 shows an example of the isolated region fabricated on the 3C—SiC substrate. FIG. 14 (a) is its plane-view optical microscope image, and FIG. 14(*b*) is its schematic cross-section, respectively. It is formed by using reactive ion etching (RIE) with 0.5-μm-thick Ni mask patterned on the 3C—SiC substrate by a photolithography.

The isolated region in FIG. 14 employs the line-space structure having a size of line width $W_L$=5 μm, space width $W_S$=20 μm and line height d=15 to 20 μm respectively. And it has the (110) and (–1-10) sidewalls due to maintaining its alignment in parallel to [–110] direction. In this case, a reduction mechanism of the stacking faults density as will be described later works for the stacking faults of exposing a carbon polar-face on the surface (called C-SF hereafter) of the two kinds of stacking faults existing in the 3C—SiC substrate.

Hereafter, it will be mainly described in the case of the isolated regions 210 fabricated through selective-etching process on the SIC substrate 200.

(II) Reduction of the Stacking Faults Density by Homo-Epitaxial Growth

Figure 13:
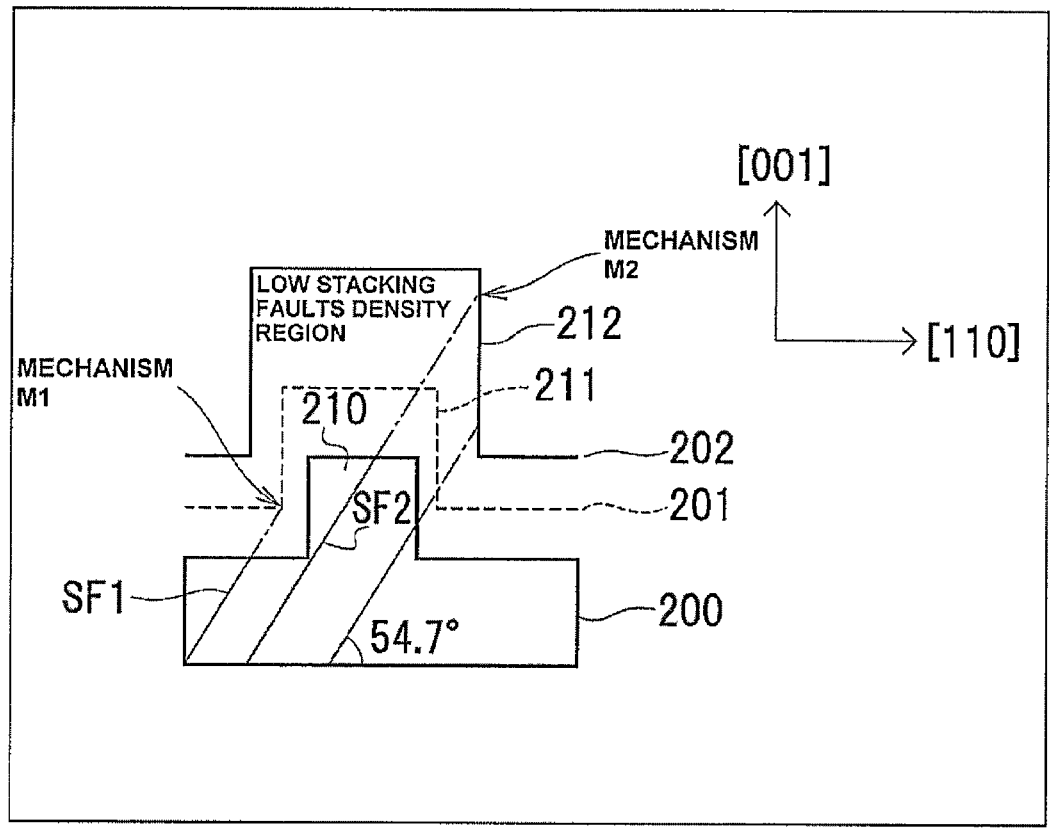
FIG. 13 is a view for describing a mechanism of reducing the stacking faults density.

FIG. 13 shows schematic diagram of reduction of the stacking faults density by homo-epitaxial growth. In principle, the stacking faults in the SiC substrate 200 propagate at an angle of 54.7 degrees with respect to (001) plane, or 35.3 degrees with respect to {110} plane, during the homo-epitaxial growth. With using this property, the stacking faults density can be significantly reduced by the following two mechanisms, named as mechanism M1 and mechanism M2.

<Mechanism M1>

First, the mechanism M1 will be described. As shown in FIG. 13, when the silicon carbide is homo-epitaxially grown on the SiC substrate 200, stacking fault SF1, which is initially exposed on the surface outside of the isolated regions 210, is propagated into the homo-epitaxial layer. However, when the homo-epitaxial layer is grown up to the surface indicated by the dashed line 201, the stacking fault SF1 is inhibited its propagation into the isolated region 211 by the side walls. Such a reducing method of the stacking faults density is called as a mechanism M1. Note that when SiC is selectively grown on the mask-patterned substrate, as shown in the second embodiment, propagation of SF1 is inhibited by the mask on the surface.

<Mechanism M2>

Next, the mechanism M2 will be described. As shown in FIG. 13, the silicon carbide is homo-epitaxially grown on the SiC substrate 200, the stacking fault SF2, which is initially exposed on the surface within the isolated regions 210, is propagated into the homo-epitaxial layer.

When the homo-epitaxial layer is grown up to the surface indicated by the dashed line 201, the position of the stacking fault SF2 becomes closer to an edge of the isolated region 211 than before. This is because the stacking fault SF2 moves toward the edge during the growth.

Finally, when the homo-epitaxial layer is grown up to the surface indicated by the solid line 202, the stacking fault SF2 reaches the side wall of the isolated region 212 (i.e., SF2 reaches the encapsulated region) and being terminated there. Such a reducing method of the stacking faults density is called as the mechanism M2.

To achieve stacking fault termination described in Mechanism M2, the propagation rate of the stacking fault SF2 toward the edge of the isolated region should be faster than the growth rate of sidewalls in the <110> direction. This condition is expressed by the following formula (2), wherein $r_{g[001]}$ indicates a growth rate in [001] direction and $r_{g[110]}$ indicates a growth rate in <110> direction, respectively.

$$r_{g[001]} \times \tan 35.3° - r_{g[110]} > 0 \qquad (2)$$

To satisfy the aforementioned formula (2), the ratio of a growth rate can be controlled by adjusting a growth temperature, a supply ratio of a source gas, and a growth pressure.

Owing to the reduction of the stacking faults density by such mechanism M1 and mechanism M2, the stacking fault initially existed in the substrate 200 is significantly reduced, consequently a surface with extremely low stacking faults density can be obtained.

More specifically, at the side wall, to terminate all of the stacking faults existing on "single isolated region" the following formula (3) should be satisfied. Wherein, a width of single isolated region is indicted by $W_L$, a growth thickness in [001] direction is indicated by $\Delta t_{[001]}$, and a growth thickness in [110] direction is indicated by $\Delta t_{[110]}$, respectively.

$$\Delta t_{[001]} \times \tan 35.3° - \Delta t_{[110]} > W_L \qquad (3)$$

However, actually, the isolated region is not formed by a simple body, but a plurality of isolated regions are arranged at certain intervals. Therefore, it is required to be taken into consideration of the adjacent other isolated regions. To maintain "isolation between the adjacent regions", which is indispensable for a stacking faults density reducing mechanism, the additional condition such that "all of the stacking faults on one isolated region is terminated before the adjacent sidewalls are merged with each other" should be also satisfied. Therefore, when the interval between the isolated regions is indicated by Ws, formula (3) is restricted by the following formula (4).

$$\Delta t_{[110]} \leq \frac{W_S}{2} \qquad (4)$$

Thus, "the condition for terminating all of the stacking faults, which are existed in the isolated region having width $W_L$ with keeping the specific intervals Ws, at the side wall" can be defined in formula (5) shown below, using a growth rate $r_g[001]$, $r_g[110]$ in each orientation.

$$\frac{r_{g[110]}}{r_{g[001]}} \leq \frac{W_S/2 \times \tan 35.3°}{(W_S/2 + W_L)} \qquad (5)$$

Figure 15:
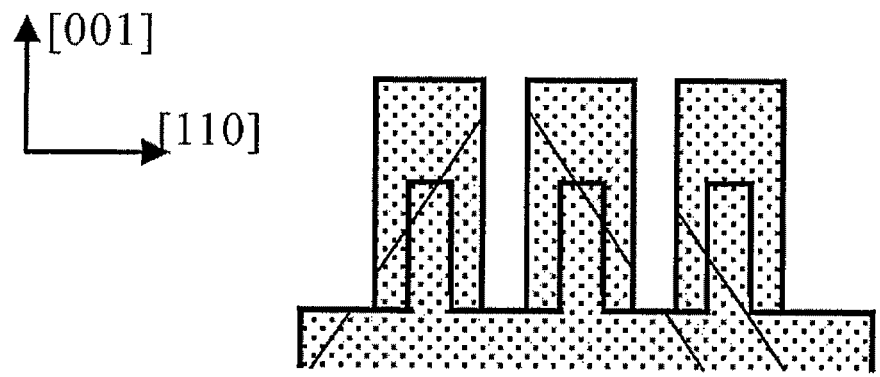
FIG. 15 is a view showing a state that all stacking faults in the isolated regions are discharged to side walls.

FIG. 15 shows the schematic cross-section of the isolated regions after performing the homo-epitaxial growth under the condition that the ratio of the growth rate in [110] and [001] directions satisfies the formula (5). At the sidewalls, termination of the stacking faults in the isolated regions can provide a defect free-surface on each isolated region as shown in FIG. 15.

Such homo-epitaxial growth condition can be realized by controlling a crystal growth direction with adjusting the crystal growth parameters in Table 2, such as the supply ratio of source gases and growth temperature, described in the second embodiment.

Figure 17:
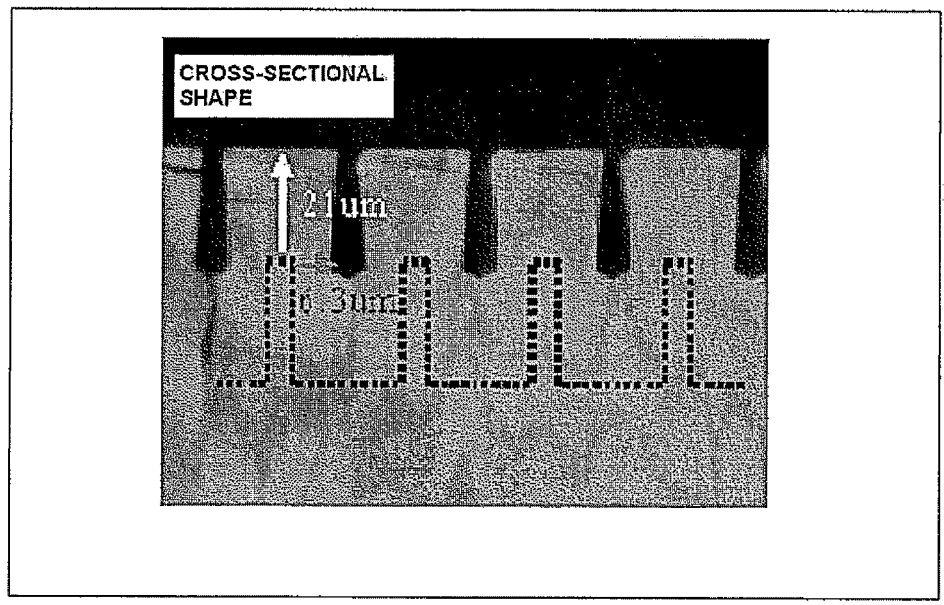
FIG. 17 shows a photograph of a cross-sectional surface during growing the isolated regions, photographed by the optical microscope.
Figure 18:
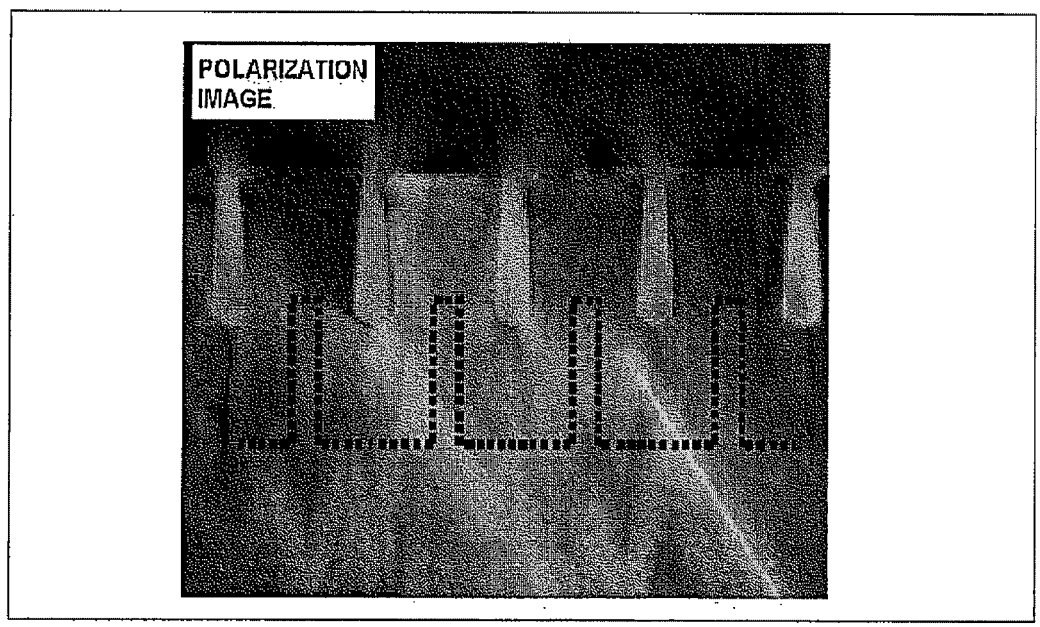
FIG. 18 shows a photograph of the cross-sectional surface during growth of the isolated regions, photographed by a polarization type transmission microscope.

FIG. 17 shows a cross-sectional optical microscope image of the isolated regions after performing the homo-epitaxial growth under the condition satisfying with the formula (5), and FIG. 18 shows their optical transmission image through polarizer. According to FIG. 18, it is clearly observed that the stacking faults existing in the isolated regions, which are observed as bright lines, are terminated at the sidewalls of the isolated regions, and consequently, a dark contrast denoting the extremely low stacking faults density is observed near the surface of the isolated regions. Thus, it is demonstrated that the stacking faults in the isolated regions can be terminated at the sidewalls by performing the homo-epitaxial growth under proper condition.

Figure 16:
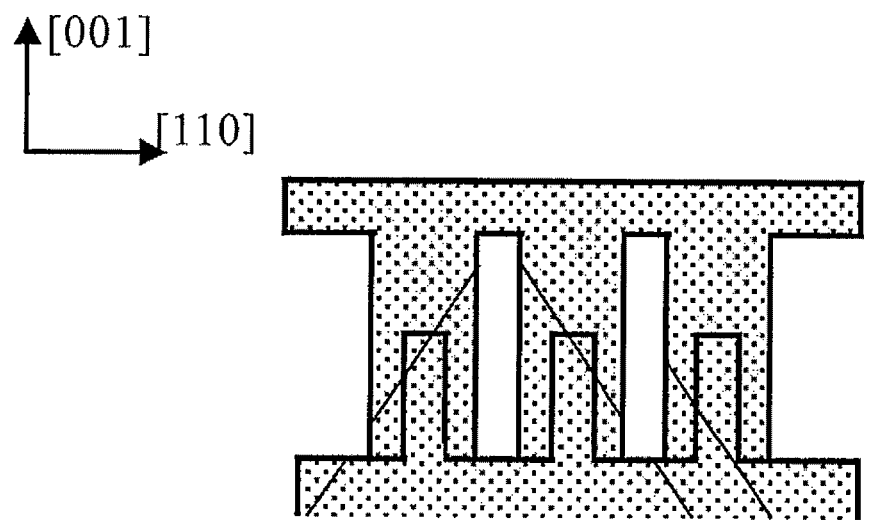
FIG. 16 is a view showing a state that the isolated regions are laterally grown to be connected to each other.

(III) Expansion of the Low Stacking Fault Density Regions by Bridging the Isolated Regions Next, the low stacking fault density region formed by the above described homo-epitaxial growth process is bridged to expand its area. FIG. 16 shows the schematic cross-section of the isolated regions with being bridged between themselves. On bridging between the isolated regions, it is quite important to maintain their sidewalls which terminate the stacking faults propagation. Unless maintaining their sidewalls, the terminated stacking faults will propagate to the surface again, and it will deviate from an original object of the present invention.

Therefore, the lateral growth at upper ends of the isolated regions is preferable to be bridged between themselves as shown in FIG. 16. Such lateral growth can be realized by controlling the crystal growth direction with adjusting the crystal growth parameters in Table 3, such as the supply ratio of source gases and growth temperature, described in the second embodiment.

Figure 19:
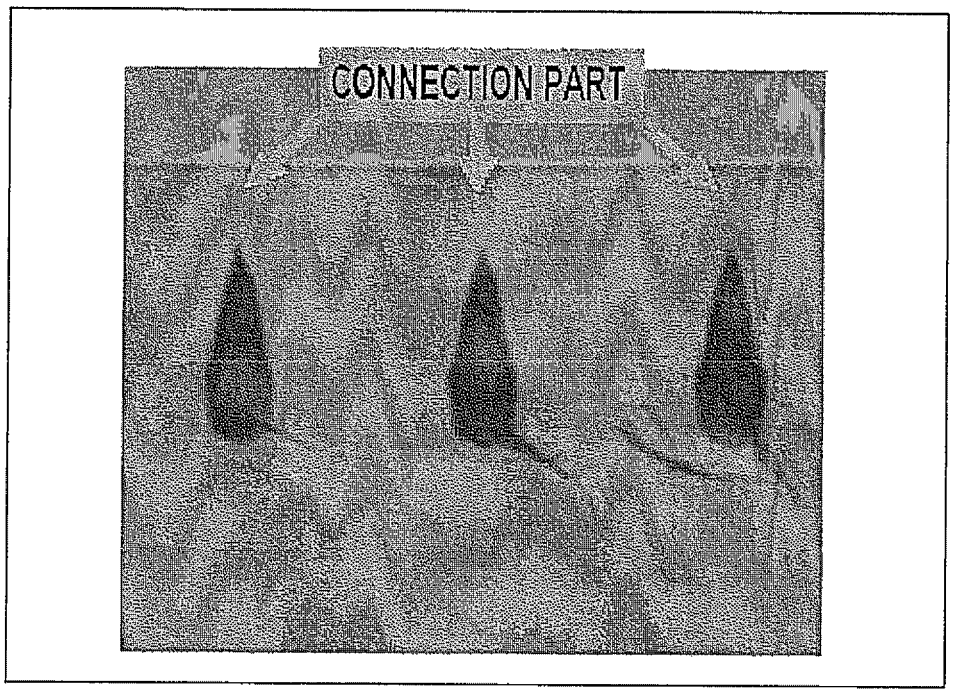
FIG. 19 shows a photograph of the cross-sectional surface when the isolated regions are connected to each other, photographed by the optical microscope.

FIG. 19 shows a cross-sectional optical microscope image of the isolated regions after bridging between themselves by the above described lateral growth. It is clearly observed that adjoining isolated regions are coalesced without formation of undesirable grain boundaries near the top surface. Such coherent coalescence between the adjoining isolated regions is not a local phenomenon.

Figure 20:
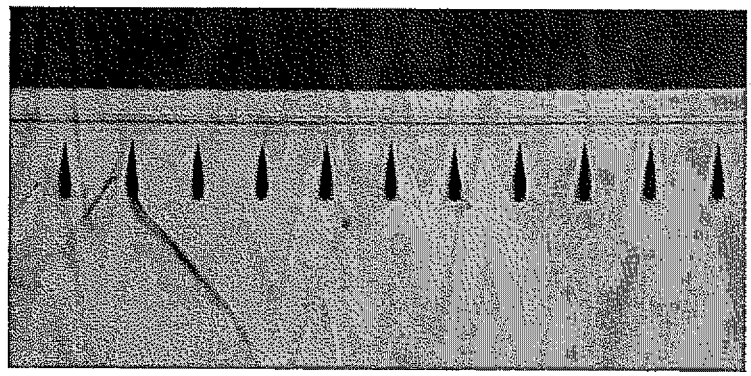
FIG. 20(a) shows a photograph of the cross-sectional surface of a substrate in which the isolated regions are connected to each other, photographed by a reflection-type optical microscope.
FIG. 20(b) shows a photograph of the same part photographed by the polarization-type transmission microscope.
Figure 20:
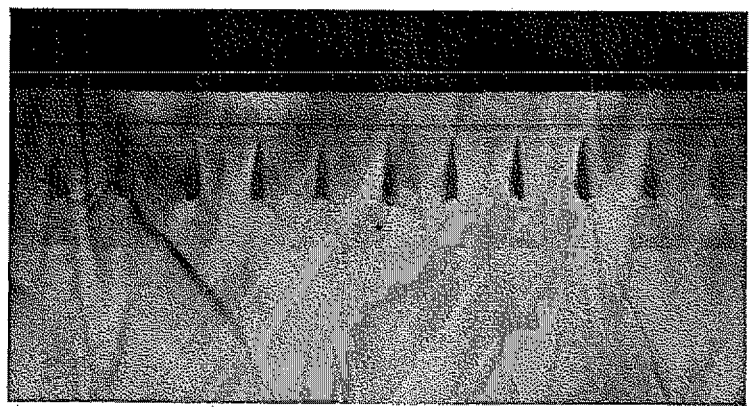

FIG. 20(*a*) shows a cross-sectional optical microscope image of the silicon carbide substrate with a plurality of the isolation regions after bridging between themselves by the above described lateral growth. Similar coherent coalescence is obtained in a wide area. At the same time, termination of the stacking faults propagation are also maintained in a wide area as shown in FIG. 20(*b*), which is an optical transmission image of the same part through polarizer. In this case, the stacking faults propagation is terminated by the hollow, formed by bridging between isolated regions. Thus, the low stacking fault density region can be expanded by bridging the isolated regions through homo-epitaxial growth with maintaining the sidewalls of the isolated regions. This is a process of (III).

The silicon carbide substrate obtained through the aforementioned processes has extremely different stacking faults density between its front surface and back surface substantially parallel to each other. This is because the stacking faults propagation from back surface(=high stacking faults density region) is prevented by the incoherent boundaries between the silicon carbide and the encapsulated regions.

(Regarding the Silicon Carbide Substrate Obtained Through the Aforementioned Process)

As is described in the aforementioned (I) to (III), the silicon carbide substrate in the first embodiment is obtained through the mechanism that the stacking fault propagation are terminated during the homo-epitaxial growth on the isolated regions having line-space structure. Hereafter, the above described formula (1), which is the necessary and sufficient condition of the dimensions of the encapsulated region for terminating the stacking fault propagation, is going to be derived with using the dimensions of the initial isolated region prior to formation of the encapsulated region. Note that a line-space structure is employed for the initial isolated region in this explanation, however, the structure of the initial isolated region is not limited thereto as long as it has the cross-sectional structure shown in FIG. 12.

The above described formula (1) is going to be derived regarding the following two different initial positions of the stacking fault before homo-epitaxial growth. One is the stacking fault initially located in the isolated region, and the other is the stacking fault initially located in the bottom of the trench (=outside of the isolated region).

(a) A Case of the Stacking Faults Initially Located in the Isolated Region

Figure 21:
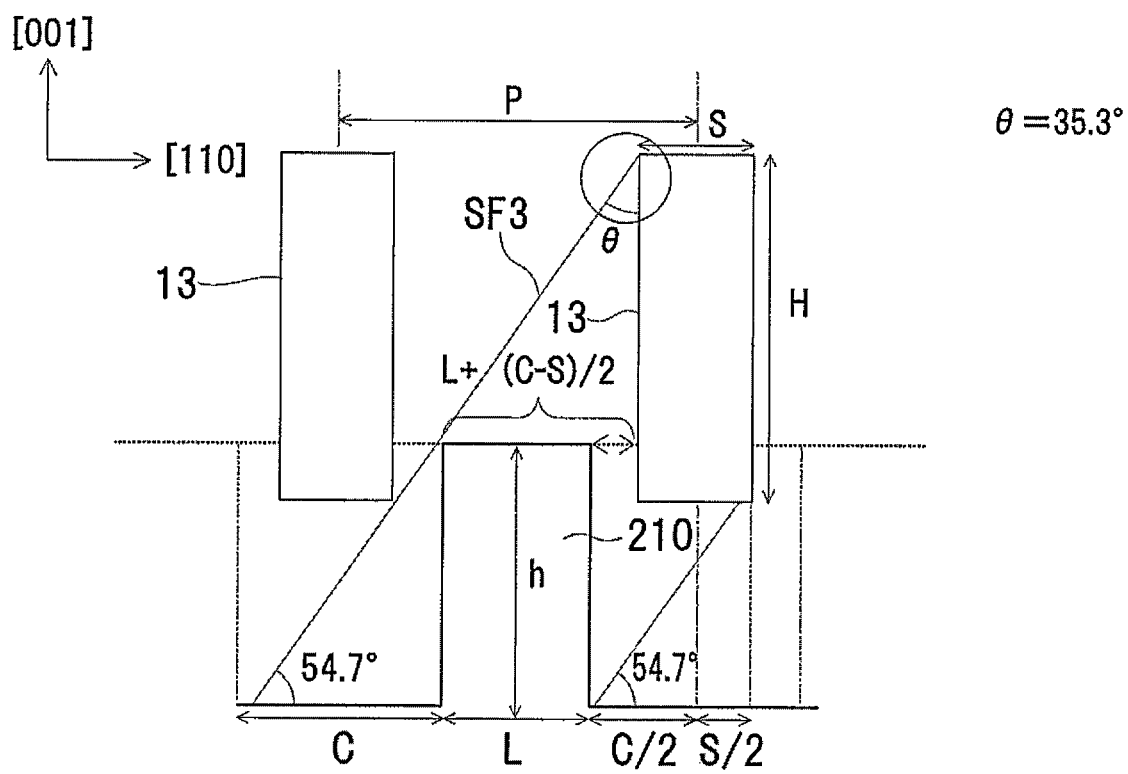
FIG. 21 is a view for describing a relation between stacking faults propagated from the lines (isolated regions), and encapsulated regions.

FIG. 21 shows the schematic image of the stacking fault termination regarding the stacking fault initially located in the isolated region (SF3). Herein, the isolated regions before homo-epitaxial growth are defined as the isolated region 210, which is the same one described in the aforementioned FIG. 12. Each parameter for the isolated region 210 before homo-epitaxial growth and each parameter for the encapsulated regions 13 formed after homo-epitaxial growth, are defined as follows.

(Each Parameter for the Isolated Region 210 Before Homo-Epitaxial Growth)

L: Width of the isolated region 210 before homo-epitaxial growth

C: Width of a space(=bottom of trench) before homo-epitaxial growth h: Height of the isolated region 210 before homo-epitaxial growth Note that the height of the isolated region h should be satisfied with the following relation: $h \geq C/\tan\theta$. Wherein, when the stacking faults are parallel to $\{111\}$ plane, and the side walls of the encapsulated regions are $\{110\}$ plane, $\theta$ is 35.3°.

(Each Parameter for the Encapsulated Region 13)

H: Height of the encapsulated region 13

S: Width of the encapsulated region 13

P: Center-to-center distance between the adjacent encapsulated regions $\theta$: Angle formed by the sidewall of the encapsulated region 13 and stacking fault (SF3)

To terminate all of the stacking faults initially located in the isolated region 13, the height H of the encapsulated region formed after homo-epitaxial growth should be satisfied with the following relation:

$$H \geq \{L+(C-S)/2\}/\tan\theta + \{h-(C+S)/2/\tan\theta\} = (L-S)/\tan\theta + h \geq (L+C-S)/\tan\theta \quad (6)$$

Wherein, L+C corresponds to the center-to-center distance of the adjacent encapsulated regions 13, and therefore the following formula (7) can be obtained.

$$H \geq (P-S)/\tan\theta \quad (7)$$

(b) A Case of the Stacking Faults Initially Located in the Bottom of the Trench

Figure 22:
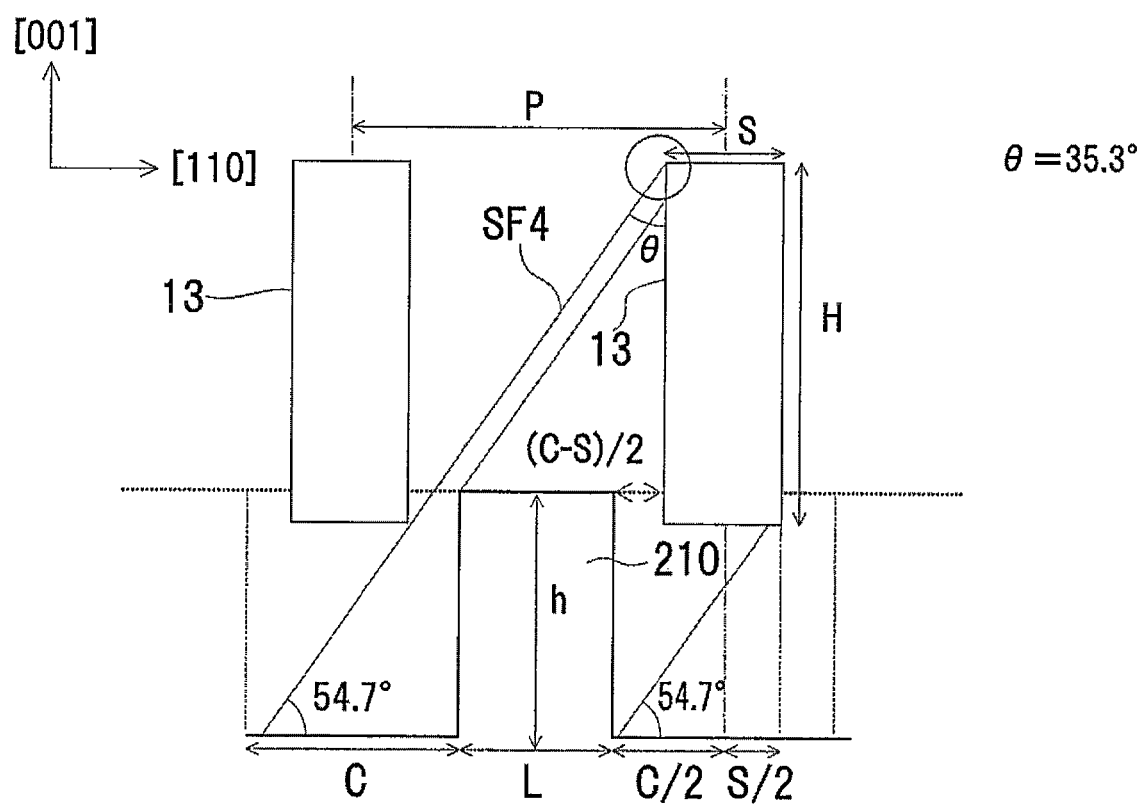
FIG. 22 is a view for describing a relation between stacking faults propagated from spaces, and encapsulated regions.

FIG. 22 shows the schematic image of the stacking fault termination regarding the stacking fault initially located in the bottom of the trench (SF4). Similar to the aforementioned case (a), each parameter for the isolated region 210 before homo-epitaxial growth and each parameter for the encapsulated regions 13 formed after homo-epitaxial growth, are defined as follows.

L: Width of the isolated region before homo-epitaxial growth

C: Width of the space before homo-epitaxial growth h: Height of the isolated region before homo-epitaxial growth Note that the height of the isolated region h should be satisfied with the following relation: $h < C/\tan\theta$. Wherein, when the stacking faults are parallel to $\{111\}$ plane, and the side walls of the encapsulated regions are $\{110\}$ plane, $\theta$ is 35.3°.

(Each Parameter for the Encapsulated Regions 13)

H: Height of the encapsulated region

S: Width of the encapsulated region

P: Center-to-center distance between the adjacent encapsulated regions $\theta$: Angle formed by the sidewall of the encapsulated region 13 and stacking fault (SF4)

To terminate all of the stacking faults initially located in the bottom of the trench, the height H of the encapsulated region formed after homo-epitaxial growth should be satisfied with the following relation:

$$H \geq \{L+(C-S)/2\}/\tan\theta - (C+S)/2/\tan\theta = (L+C-S)/\tan\theta \quad (8)$$

In this formula (8), L+C corresponds to the center-to-center distance of the adjacent encapsulated regions 13, and therefore the following formula (7) can be obtained.

$$H \geq (P-S)/\tan\theta \quad (7)$$

This formula (7), which is derived as the necessary and sufficient conditions for termination of the stacking faults located in whole of the substrate before homo-epitaxial growth, is nothing but the formula (1). Because the difference of P−S corresponds to an interval between the adjacent encapsulated regions, represented by W in formula (1).

(Effect of the First Embodiment)

According to the first embodiment, by executing a manufacturing procedure described in (I) to (III), the encapsulated regions are introduced inside of the substrate, thereby forming the incoherent boundaries between the encapsulated regions and the silicon carbide. Thus, the propagation of the stacking faults in the silicon carbide can be blocked at the incoherent boundaries, and therefore the low stacking faults density can be achieved on the surface of the silicon carbide substrate. Accordingly, a preferable silicon carbide substrate for the semiconductor device use can be obtained.

Note that the cubic silicon carbide with (001) plane as the main surface, is used as the substrate in this embodiment. However, the cubic silicon carbide substrate with (111) plane as the main surface may also be used. In this case, the side walls of the encapsulated regions is formed in parallel to any one of {111} plane, {110} plane or {211} plane.

Further, hexagonal silicon carbide with {11-20} plane or {03-38} plane can also be used as the main surface. In this case, (0001) plane is formed as the closest-packed plane to which the stacking faults are propagated, with stacking faults crossing the main surface at an angle of 30 to 60 degrees. Therefore, by executing each step of the present invention as described above, similar effects as this embodiment can be obtained.

When the hexagonal silicon carbide with {0001} plane as the main surface is used, the side walls of the encapsulated regions are formed in parallel to {11-20} plane or {-1100} plane. In this case, (0001) plane is formed as the closest-packed plane to which the stacking faults are propagated, with stacking faults crossing the main surface at an angle of 30 to 60 degrees. Therefore, by executing each step of the present invention as described above, similar effects as this embodiment can be obtained.

Further, the silicon carbide substrate formed in this embodiment is capable of blocking the propagation of the stacking faults secondarily generated after forming the substrate (generated subsequent to formation of the substrate).

<Second Embodiment>

The silicon carbide substrate according to a second embodiment of the present invention will be described hereafter.

Figure 9:
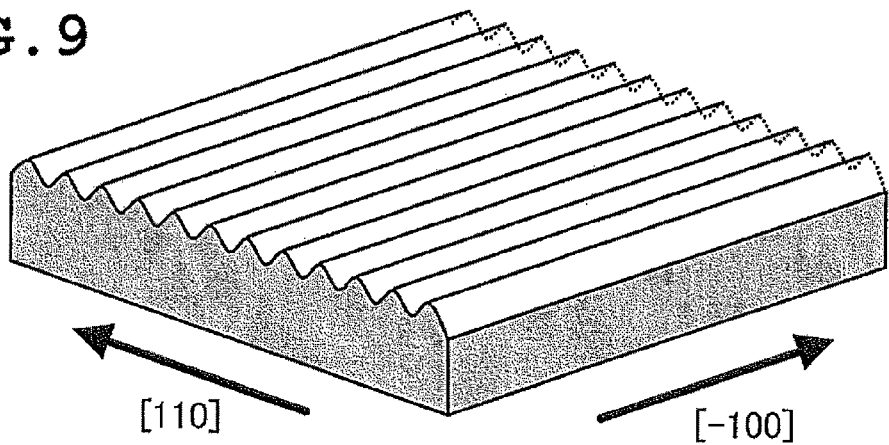
FIG. 9 is a perspective view of a Si substrate in which undulations having parallel ridges in one direction are formed, according to a conventional example.
Figure 10:
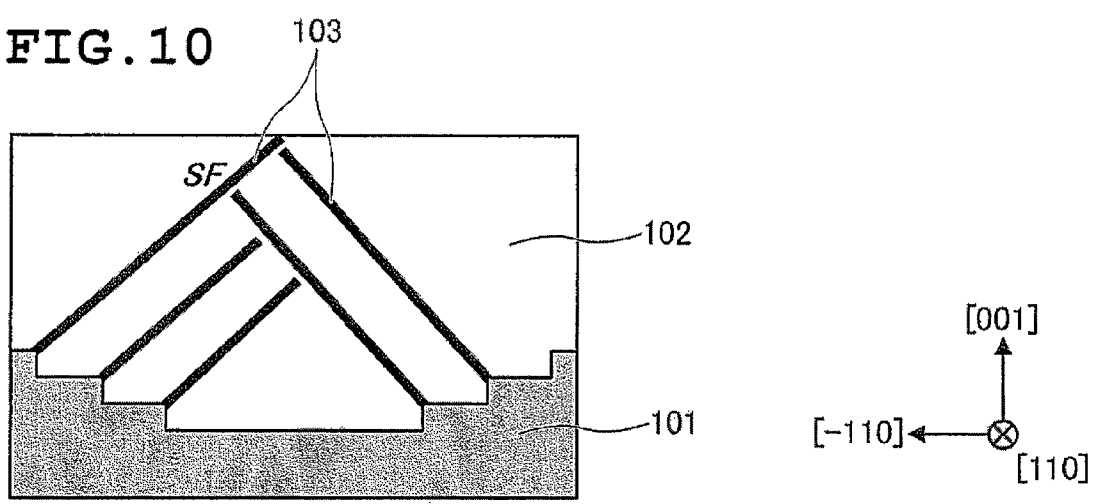
FIG. 10 is a cross-sectional view when silicon carbide is grown on the Si substrate.
Figure 11:
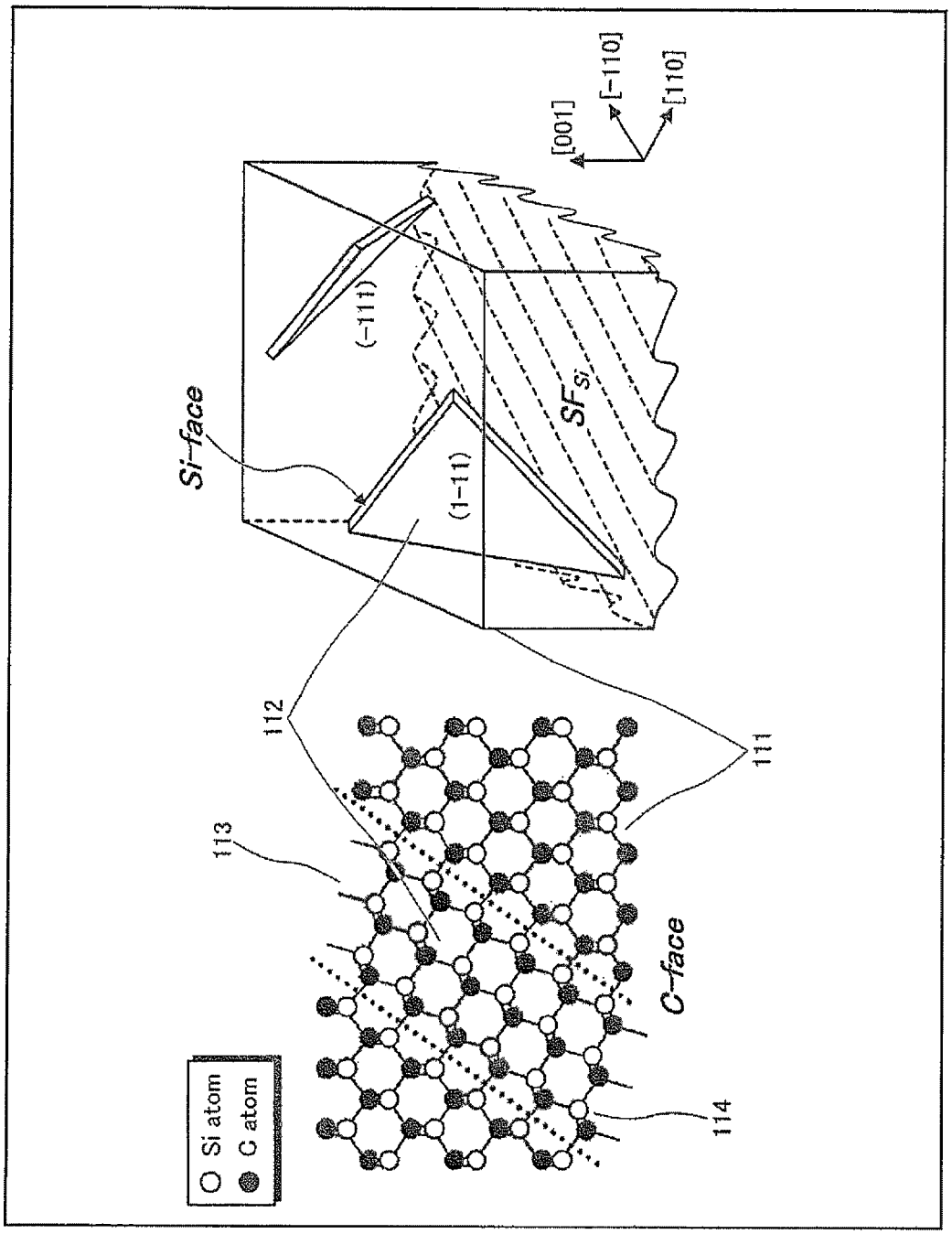
FIG. 11 is a view for describing a stacking faults structure inside of cubic silicon carbide.

First, in order to form the undulations in parallel to the [−110] direction, as shown in FIG. 9, on Si(001) surface, the polishing scratches were introduced on the surface of 4-inch Si(001) substrate by rubbing with the abrasive grains in one direction. Diamond slurry with a grain size of about 9 μm was used as the abrasive grains for introducing the polishing scratches. By rubbing the surface of the Si(001) substrate in a [−110] direction with a commercially available polishing cloth (EngisM414) soaked with this diamond slurry, innumerable polishing scratches which are approximately parallel with each other, were formed. A pressure for rubbing the surface of the substrate in a prescribed direction was set to 0.2 kg/cm$^2$, and the polishing cloth was reciprocally moved about 300 times in one direction to introduce the polishing scratches.

Next, in order to remove the residual abrasive grains on the processed surface, the following substrate cleaning was performed. After ultrasonic cleaning with pure water, the processed substrate was dipped in a mixed solution of a hydrogen peroxide solution and a sulfuric acid at a ratio of 1:1, and then a hydrofluoric acid solution. Then, a thermal oxide layer with a thickness of about 0.5 μm was formed on the processed substrate by sacrificial thermal oxidation, and thereafter the thermal oxide layer was removed by dilute hydrofluoric acid. Through the above described processes, the undulations, which are continuous wavy shape parallel to [−110] direction shown in FIG. 9, with a depth of a groove being 30 to 50 nm, a width of being 1 to 2 μm, and a gradient of being 3 to 5 degrees were obtained.

Next, in order to grow the thick cubic silicon carbide layer on the above described undulant-Si(001) substrate, the undulant-Si(001) substrate was heated up from room temperature to 1350 degree C. in a CVD apparatus. During heating up process, a mixed gas of $C_2H_2$ and $H_2$ was continuously supplied to form an ultrathin initial silicon carbide layer. The flow rates of $C_2H_2$ and $H_2$ and the growth pressure are shown in table 1.

TABLE 1

| | |
|---|---|
| Supply amount of $C_2H_2$ | 30 cc/min |
| Supply amount of $H_2$ | 100 cc/min |
| Pressure | 20 Pa |

After the temperature of the substrate surface reached at 1350 degree C., supply of the mixed gas of $C_2H_2$ and $H_2$ was maintained for 15 minutes. Subsequently, $SiH_2Cl_2$ and $C_2H_2$ and $H_2$ were supplied at 1350 degree C. to hetero-epitaxially grow the thick silicon carbide layer. Note that growth conditions for growing the thick silicon carbide layer are shown in table 2. The growth pressure is adjusted by a pressure control valve installed in the middle of the exhaust line.

TABLE 2

| | |
|---|---|
| Supply amount of $SiH_2Cl_2$ | 50 cc/min |
| Supply amount of $C_2H_2$ | 10 cc/min |
| Pressure | 40 Pa |
| Temperature | 1,350° C. |

The silicon carbide growth was performed for 8 hours under the growth conditions shown in Table 2 to grow 450-μm-thick cubic silicon carbide on the undulant-Si(001) substrate. Subsequently, wet etching of the undulant-Si(001) substrate with a mixed acid of hydrofluoric acid and nitric acid was performed to obtain free-standing 450-μm-thick single crystal cubic silicon carbide substrate.

Herein, in order to evaluate a defect density of the cubic silicon carbide substrate fabricated through the above described processes, the substrate was dipped into molten KOH at 500 degree C. for 5 minutes to expose the etch-pits on the surface. And then the etch-pits were observed by the optical microscopy. As a result, the stacking faults density of 8×10$^5$/cm$^2$ and no anti-phase boundaries were observed on the entire main surface of the cubic silicon carbide substrate.

Next, in order to fabricate the thermal SiO$_2$ mask for selective-silicon carbide growth, 100-nm-thick thermal SiO$_2$ layer was formed on entire main surface by dry oxidation at 1100 degree C. for 30 minutes. Then, the positive photoresist layer of 2 μm in thickness was coated on the surface of the thermal SiO$_2$ layer, and a square array pattern was formed by exposure to ultraviolet ray (g-line of mercury) using a photomask. Wherein, each side of an individual square pattern was aligned to be parallel to <110> orientation of the cubic silicon carbide substrate. A width of each side of the individual square pattern (corresponding to the width S of the encapsulated region 13 in FIG. 1) is 2 μm, and its interval (corresponding to the interval W between the adjoining encapsulated regions 13 in FIG. 1) is 5 μm, respectively.

Figure 2:
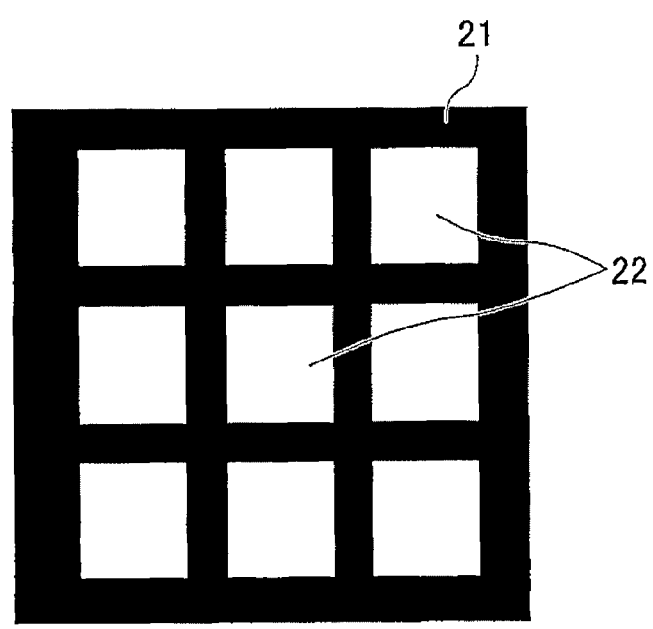
FIG. 2 is a plane-view of a surface of a front surface of a cubic silicon carbide substrate covered with the lattice-shaped SiO$_2$ mask according to a second embodiment of the present invention.

Next, the dry etching of the thermal oxide layer with a patterned photoresist mask was performed by F-plasma of 100 W. After that, the photoresist mask was completely removed by oxygen plasma. Finally, the lattice-shaped thermal SiO$_2$ mask, shown in FIG. 2, with a plurality of square apertures 22 aligned with keeping constant interval 21 were obtained.

Figure 3:
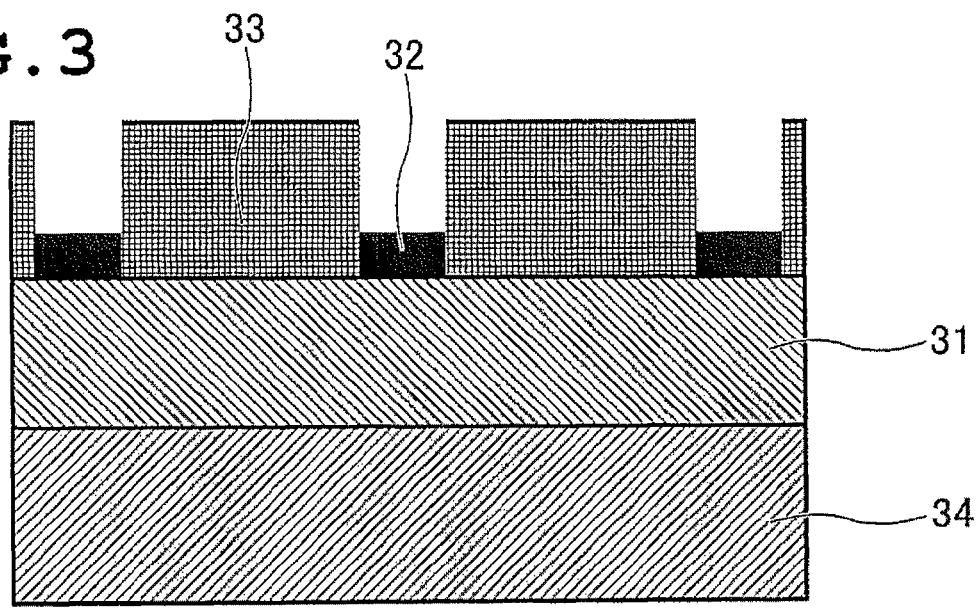
FIG. 3 is a cross-sectional view of the cubic silicon carbide substrate.

Subsequently, 10-μm-thick cubic silicon carbide layer was homo-epitaxially grown on the above described patterned substrate for 10 minutes under the growth conditions shown in Table 2. FIG. 3 shows a cross-sectional view of the cubic silicon carbide substrate after this growth process. As shown in FIG. 3, the silicon carbide homo-epitaxial layer 33 was selectively grown on a silicon carbide layer 31 through the apertures of the lattice-shaped SiO$_2$ mask 32.

Next, the substrate through the above described processes was dipped into a mixed acid of hydrofluoric acid and nitric acid to remove both of the thermal SiO$_2$ mask on surface and Si(001) layer on backside of the substrate. Consequently, as shown in FIG. 4, a plurality of isolated regions of single crystal silicon carbide 33 with a height of 10 μm, width of 2 μm, and interval of 5 μm were obtained on the 113-μm-thick silicon carbide layer 31.

Figure 4:
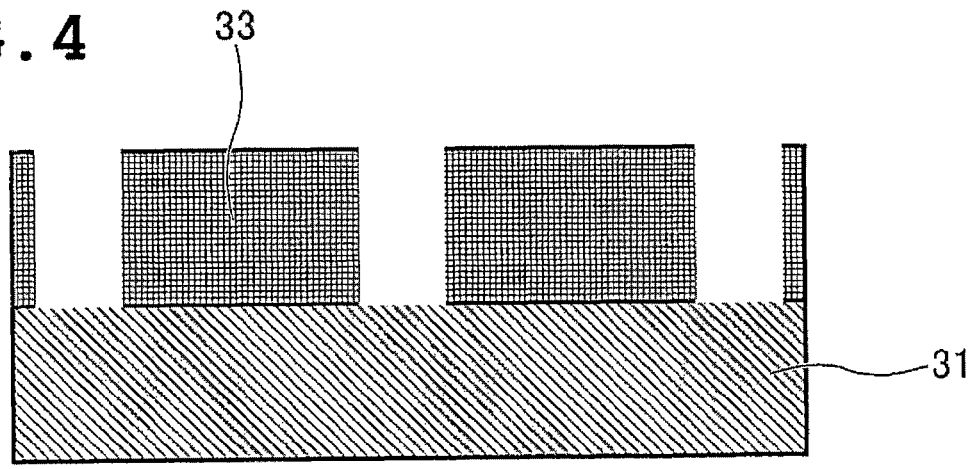
FIG. 4 is a cross-sectional view of the cubic silicon carbide substrate.
Figure 5:
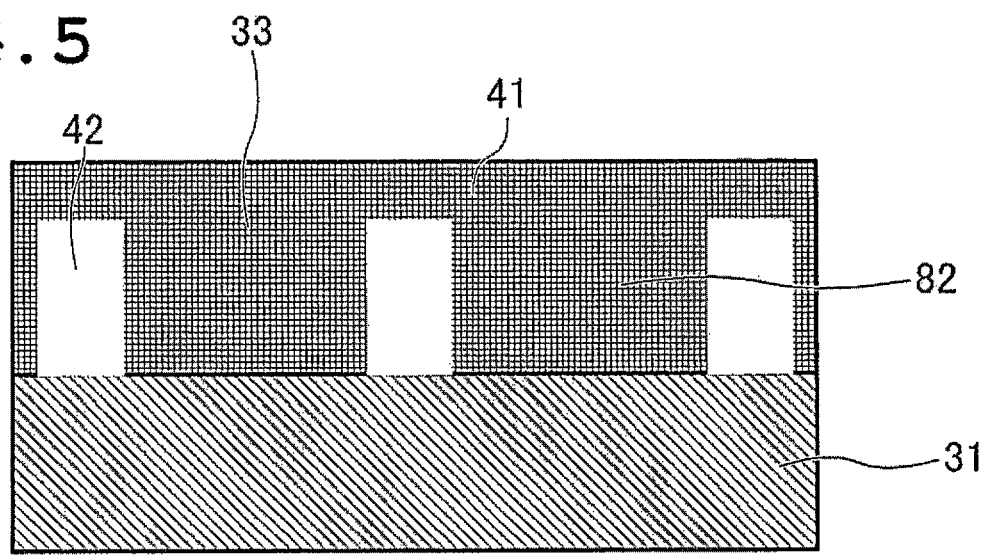
FIG. 5 is a cross-sectional view of the cubic silicon carbide substrate.

Next, additional silicon carbide homo-epitaxial layer was grown on the isolated regions 33 in FIG. 4 to form the encapsulated regions. FIG. 5 shows the cross-sectional image of the cubic silicon carbide substrate after this additional growth. By the additional growth for 60 minutes under the condition shown in table 3, 10-μm-thick silicon carbide layer 41 was homo-epitaxially grown on the isolated regions 33 and bridged among them. Consequently, the encapsulated regions 42 with a width of 2 μm, an interval of 5 μm, and a height of 10 μm were obtained at 10 μm below the main surface.

TABLE 3

| Supply amount of SiH$_2$Cl$_2$ | 5 cc/min |
|---|---|
| Supply amount of C$_2$H$_2$ | 1 cc/min |
| Supply amount of hydrogen | 10 cc/min |
| Pressure | 4 Pa |
| Temperature | 1,450° C. |

Next, the cubic silicon carbide substrate fabricated by the above step was dipped into molten KOH of 500 degrees for 5 minutes, to thereby make the faults appear. Thereafter, when the main surface of the cubic silicon carbide substrate was observed by the optical microscope, it was found that the faults density in the surface was $2 \times 10^2/cm^2$, As described above, in this embodiment, the stacking faults density could be reduced by 3-digits by providing the encapsulated regions.

In this embodiment, the cubic silicon carbide (001) face is used as the main surface of the silicon carbide substrate. However, the present invention is not limited thereto. For example, the hexagonal silicon carbide can also be used with {11-20} plane and {03-38} plane as the main surfaces. In this case, the closest-packed plane to which the stacking faults are propagated is corresponded to (0001) face, hence the stacking faults intersect the main surface at an angle in the range of 30-60 degrees. Therefore, by executing the aforementioned each processes of this embodiment, similar effects as this embodiment can be obtained.

With respect to an effect of reducing the stacking faults density provided by present invention, some experimental results were presented hereafter. In the second embodiment, the encapsulated regions were formed at 10 μm below the main surface by the additional homo-epitaxial growth for 60 minutes under the condition shown in Table 3. Wherein, the location of the encapsulated regions depends on the thickness of the additional growth layer 41 and its location was closely related with the effect of reducing the stacking fault density on the main surface. Table 4 shows the relationship between the location of the encapsulated regions (depth of the encapsulated region) and the stacking faults density remaining on the main surface. It was found that an effect of reducing the stacking faults density becomes stronger with decreasing the depth of encapsulated region, especially 100 μm or below.

TABLE 4

| Depth of encapsulated region (μm) | Stacking faults density (/cm) |
|---|---|
| 50 | 200 |
| 64 | 250 |
| 83 | 250 |
| 91 | 273 |
| 104 | 417 |
| 137 | 877 |
| 165 | 2,508 |
| 191 | 14,393 |
| 200 | 13,505 |

In addition to the above described defect density measurement, reverse characteristics measurement of p-n diodes fabricated on the silicon carbide substrate listed in Table 4 was performed. First, 3C—SiC homo-epitaxial layer was grown on the substrates listed in Table. 4 under the condition shown in Table 5. Through this homo-epitaxial growth process, 10-μm-thick n-type cubic silicon carbide layer with doping concentration of $5 \times 10^{15}/cm^3$ was obtained without intentional nitrogen doping.

TABLE 5

| Supply amount of SiH$_2$Cl$_2$ | 3 cc/min |
|---|---|
| Supply amount of C$_2$H$_2$ | 1 cc/min |
| Supply amount of hydrogen | 100 cc/min |
| Pressure | 4 Pa |
| Temperature | 1,550° C. |

Then, Al ions were implanted to an entire surface of the homo-epitaxial layer to form p-n junction. An implantation depth is 1 μm, and an acceleration energy is adjusted in a range of 30-700 keV to obtain the constant doping profile of $1 \times 10^{18}/cm^3$ in a depth direction. After implantation of Al ions, activation annealing was applied to the surface at 1600 degree C. for 10 minutes in Ar atmosphere. Next, an array of Ni circular masks with a diameter of 100 μm was fabricated on the surface by a photolithography technique, and then rf-RIE was applied thereto for 5 minutes at 200 W with supplying a gas of CF4(100 sec)+O$_2$(20 sccm). Finally, a plurality of mesa-type p-n diodes with a depth of 0.2 μm was obtained on the surface layer. Table 6 shows the leakage current density at reverse voltage of 600V for mesa-type p-n diodes fabricated on the substrates listed in Table 4. Reduction of a leakage current density was clearly demonstrated at a depth of the encapsulated region of 100 μm or below, particularly 50 μm.

TABLE 6

| Depth of the encapsulated region (μm) | Leak current density (A/cm$^2$) |
|---|---|
| 50 | <2 × 10$^{-8}$ |
| 64 | 4 × 10$^{-7}$ |
| 83 | 4 × 10$^{-7}$ |
| 91 | 1 × 10$^{-6}$ |
| 104 | 5 × 10$^{-4}$ |
| 137 | 2 × 10$^{-3}$ |
| 165 | >2 × 10$^{-3}$ |
| 191 | >2 × 10$^{-3}$ |
| 200 | >2 × 10$^{-3}$ |

As described in the second embodiment, when a p-n diode was fabricated on the silicon carbide layer homo-epitaxially grown on the silicon carbide substrate including encapsulated regions with a depth of 100 μm or below, remarkable reduction of leakage current caused by the stacking faults was provided. This leakage current reduction effect was provided to not only a p-n diode but the other semiconductor device having similar internal electric field, such as a MOSFET type semiconductor device and so on.

Note that the cubic silicon carbide is used as the substrate in this embodiment, however, similar effects as this embodiment can be provided to the hexagonal silicon carbide substrate.

The silicon carbide substrate obtained through the aforementioned processes has extremely different stacking faults density between its front surface and back surface substantially parallel to each other. This is because the stacking faults propagation from back surface(=high stacking faults density region) is prevented by the incoherent boundaries between the silicon carbide and the encapsulated regions.

Further, the silicon carbide substrate formed in this embodiment is capable of blocking the propagation of the stacking faults generated secondarily after formation of the substrate (generated subsequent to formation of the substrate).

<Third Embodiment>

The silicon carbide substrate according to a third embodiment of the present invention will be described hereafter.

First, similarly to the second embodiment of the present invention, the undulations were formed on the entire surface of 4-inch Si(001) substrate by rubbing with the abrasive grains in [−110] direction. Subsequently, the residual abrasive grains on the processed surface were cleaned off by the same cleaning process described in the second embodiment. Then, 0.5-μm-thick thermal oxide layer was formed on the undulant Si (001) substrate by sacrificial thermal oxidation and thereafter the thermal oxide layer was removed by a dilute hydrofluoric acid. Through the above described processes, the undulations, which are continuous wavy shape parallel to [−110] direction shown in FIG. 9, with a depth of a groove being 30-50 nm, a width of being 1-2 μm, and a gradient of being 3-5 degrees were obtained.

Next, in order to grow the thick cubic silicon carbide layer on the undulant Si(001) substrate, an ultrathin initial silicon carbide layer was grown under the growth condition in Table 1 described in the second embodiment.

Subsequently, 113-um-thick cubic silicon carbide layer, indicated by part 31 in FIG. 3, was grown for 2 hours under the growth conditions in Table 2.

Herein, in order to evaluate a defect density of the cubic silicon carbide substrate fabricated through the above described processes, the substrate was dipped into molten KOH at 500 degree C. for 5 minutes to expose the etch-pits on the surface. And then the etch-pits were observed by the optical microscopy. As a result, the stacking faults density of 8×10$^5$/cm$^2$ and no anti-phase boundaries were observed on entire main surface.

Next, in order to fabricate the thermal SiO$_2$ mask for selective-silicon carbide growth, 100-nm-thick thermal SiO$_2$ layer was formed on entire main surface by dry oxidation at 1100 degree C. for 30 minutes. Then, the positive photoresist layer of 2 μm in thickness was coated on the surface of the thermal SiO$_2$ layer, and a square array pattern was formed by exposure to ultraviolet ray (g-line of mercury) using a photomask. Wherein, each side of an individual square pattern was aligned to be parallel to <110> orientation of the cubic silicon carbide substrate. A width of each side of the individual square pattern (corresponding to the width S of the encapsulated region 13 in FIG. 1) is 2 μm, and its interval (corresponding to the interval W between the adjoining encapsulated regions 13 in FIG. 1) is 5 μm, respectively.

Next, the dry etching of the thermal oxide layer with a patterned photoresist mask was performed by F-plasma of 100 W.

Subsequently, 10-μm-thick cubic silicon carbide layer was homo-epitaxially grown on the above described patterned substrate for 10 minutes under the growth conditions shown in Table 2. Similarly to the second embodiment, the silicon carbide homo-epitaxial layer was selectively grown on a silicon carbide layer through the apertures of the lattice-shaped SiO$_2$ mask.

Next, the substrate through the above described processes was dipped into a mixed acid of hydrofluoric acid and nitric acid to remove both of the thermal SiO$_2$ mask on surface and Si(001) layer on backside of the substrate. Consequently, as shown in FIG. 4, a plurality of isolated regions of single crystal silicon carbide with a height of 10 μm, width of 2 μm, and interval of 5 μm were obtained on the 113-μm-thick silicon carbide layer.

Figure 6:
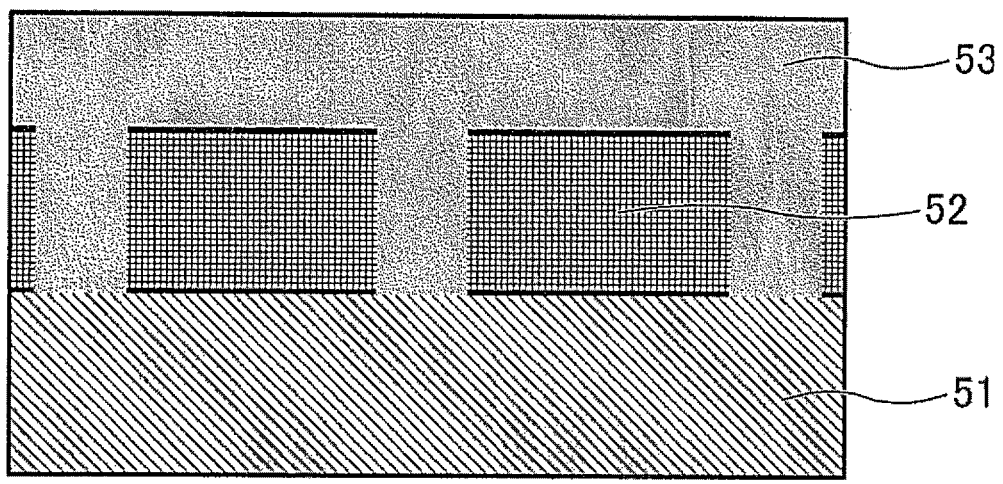
FIG. 6 is a cross-sectional view of the cubic silicon carbide substrate according to a third embodiment of the present invention.

Next, polycrystalline silicon layer was deposited on the entire surface of the above described silicon carbide substrate. FIG. 6 shows the cross-sectional image of the cubic silicon carbide substrate after this polycrystalline silicon growth. By the additional growth for 240 minutes under the condition shown in Table 7, 20-μm-thick polycrystalline silicon layer 53 was grown on both of surfaces of the isolated regions 52 and the valley between them.

Figure 7:
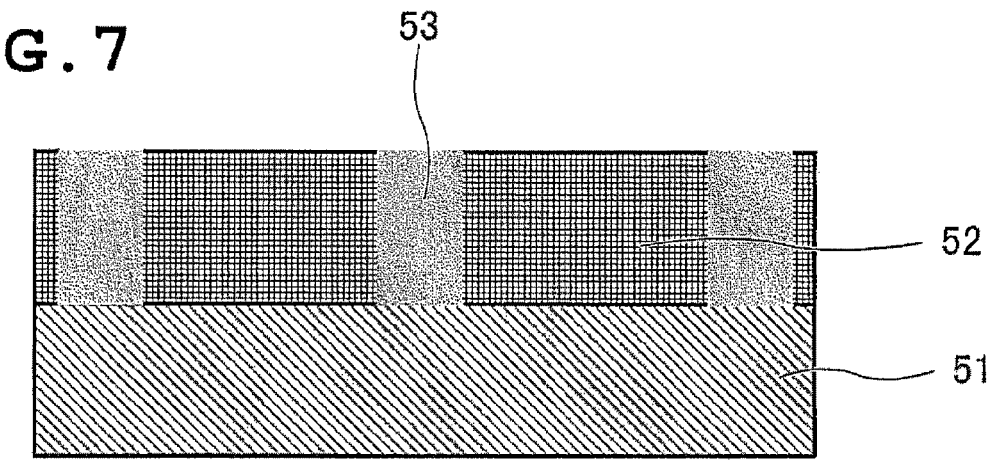
FIG. 7 is a cross-sectional view of the cubic silicon carbide substrate.

Next, the polycrystalline silicon layer 53 was removed by polishing process to expose the single crystal silicon carbide on the surface of the isolated regions 52. FIG. 7 shows the cross-sectional image of the cubic silicon carbide substrate after this polishing process. By the surface polishing of 20-μm-thick polycrystalline silicon layer using diamond abrasive grains of 0.5 μm and 0.1 μm, the isolated regions 52 exposed single crystal silicon carbide surface surrounded with the polycrystalline silicon layer 53 were obtained.

Figure 8:
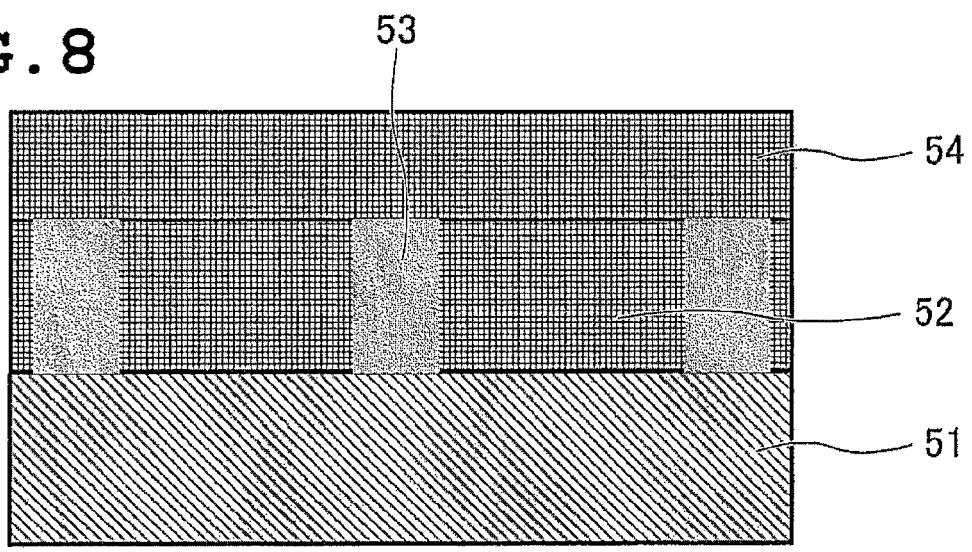
FIG. 8 is a cross-sectional view of the cubic silicon carbide substrate.

Subsequently, silicon carbide homo-epitaxial layer was grown on the isolated regions 52 under the condition in Table. 3. During this homo-epitaxial growth, silicon carbide was preferably grown on the isolated regions 52 because on the polycrystalline silicon layer 53, thermal etching was dominant under this condition. FIG. 8 shows the cross-sectional image of the cubic silicon carbide substrate after this homo-epitaxial growth. By the homo-epitaxial growth for 10 minutes, 10-μm-thick silicon carbide layer 54 was homo-epitaxially grown on the isolated regions 52 and covered over the polycrystalline layer 53. Consequently, the encapsulated regions 53 made of the polycrystalline silicon with a width of 2 μm, an interval of 5 μm, and a height of 10 μm were obtained at 10 μm below the main surface.

TABLE 7

| | |
|---|---|
| Supply amount of SiH$_2$Cl$_2$ | 50 cc/min |
| Supply amount of hydrogen | 100 cc/min |
| Pressure | 35 Pa |
| Temperature | 1,050° C. |

Herein, in order to evaluate a defect density of the cubic silicon carbide substrate fabricated through the above described processes, the substrate was dipped into molten KOH at 500 degree C. for 5 minutes to expose the etch-pits on the surface. And then the etch-pits were observed by the optical microscopy. As a result, the stacking faults density of $2 \times 10^2$/cm$^2$ was observed on entire main surface. In the third embodiment, the stacking faults density could be reduced by about 3 orders of magnitude by introducing the encapsulated regions.

Note that in this embodiment, the encapsulated region consists of polycrystalline silicon. However, the present invention is not limited thereto. For example, the other materials, such as single crystal silicon, graphite, diamond-like carbon or silicon nitride can provide the similar effect as this embodiment.

In this embodiment, the cubic silicon carbide (001) face is used as the main surface of the silicon carbide substrate. However, the present invention is not limited thereto. For example, the hexagonal silicon carbide can also be used with {11-20} plane and {03-38} plane as the main surfaces. In this case, the closest-packed plane to which the stacking faults are propagated is corresponded to (0001) face, hence the stacking faults intersect the main surface at an angle in the range of 30-60 degrees. Therefore, by executing the aforementioned each processes of this embodiment, similar effects as this embodiment can be obtained.

The silicon carbide substrate obtained through the aforementioned processes has extremely different stacking faults density between its front surface and back surface substantially parallel to each other. This is because the stacking faults propagation from back surface(=high stacking faults density region) is prevented by the incoherent boundaries between the silicon carbide and the encapsulated regions.

Further, the silicon carbide obtained in this embodiment can also block the propagation of the stacking faults secondarily generated by additional annealing processes, such as an activation annealing.

As described above in detail, according to the present invention, there is provided the silicon carbide substrate that can be preferably used as the substrate for the semiconductor device. By introducing the encapsulated region in a suitable depth from the main surface, with well-controlled width, height, and interval, the stacking faults propagation in parallel to the closest-packed plane can be effectively prevented.

In other words, the silicon carbide substrate of the present invention has the encapsulated region including at least one of the silicon, carbon, nitrogen, hydrogen, helium, neon, argon, krypton, and xenon, or the encapsulated region formed by a space (including a vacuum space). Thus, the incoherent boundary is formed between the silicon carbide and the encapsulated region, hence the stacking faults propagation in the silicon carbide can be prevented at the incoherent boundary. Accordingly, the surface of the silicon carbide substrate with low stacking faults density can be obtained.

Note that the present invention is not limited to the aforementioned each embodiment, and can be variously modified in a range not departing from the gist of the present invention.

Further, constituting features in the aforementioned each embodiment can be replaced with the existing constituting features suitably, and there can be various variations including a combination of the constituting features and the existing constituting features. Accordingly, content of the present invention within a scope of the claims, is not limited by the description of the aforementioned each embodiment.

DESCRIPTION OF SIGNS AND NUMERALS

1 Silicon carbide substrate
11 Cubic silicon carbide
12 Main surface
13 Encapsulated region
14 Stacking fault

The invention claimed is:

1. A silicon carbide substrate having at least stacking faults inside, comprising encapsulated regions inside of the substrate, forming incoherent boundaries between the encapsulated regions and silicon carbide, wherein propagation of the stacking faults in the silicon carbide is blocked at the incoherent boundaries, wherein when a height of the encapsulated region in a direction parallel to a thickness direction of the silicon carbide substrate is represented by H, a width of the encapsulated region is represented by S, center-to-center distance between the adjacent encapsulated regions is represented by P, and an angle formed by the stacking faults and the incoherent boundaries is represented by θ, $H \geq (P-S)/\tan \theta$ is satisfied.

2. The silicon carbide substrate according to claim 1, wherein the encapsulated regions include at least one of silicon, carbon, nitrogen, hydrogen, helium, neon, argon, krypton, and xenon.

3. The silicon carbide substrate according to claim 1, wherein the encapsulated regions are hollow.

4. The silicon carbide substrate according to claim 1, wherein the silicon carbide substrate has two surfaces substantially parallel to each other and having different stacking faults density, and propagation of the stacking faults from one surface with high stacking faults density to the other surface with low stacking faults density, is blocked at the incoherent boundaries between the silicon carbide and the encapsulated regions.

5. A silicon carbide substrate having at least stacking faults inside and having at least one or more main surfaces, comprising
a plurality of encapsulated regions inside,
wherein the plurality of encapsulated regions are distributed substantially in parallel to one of the main surfaces, and propagation of the stacking faults is blocked at side walls, being boundaries between the silicon carbide and the encapsulated regions, and when a height of the encapsulated region in a direction parallel to a thickness direction of the silicon carbide substrate is represented by H, a width of the encapsulated region is represented by S, center-to-center distance between the adjacent encapsulated regions is represented by P, and an angle formed by the stacking faults and the incoherent boundaries is represented by θ, $H \geq (P-S)/\tan \theta$ is satisfied.

6. The silicon carbide substrate according to claim 1, wherein the silicon carbide substrate is a cubic silicon carbide with its main surface formed as {001} plane, and the incoherent boundaries are formed in parallel to {110} plane.

7. The silicon carbide substrate according to claim 1, wherein the silicon carbide substrate is a cubic silicon carbide with its main surface formed as {111} plane, and the incoherent boundaries are formed in parallel to any one of {111} plane, {110} plane, or {211} plane.

8. The silicon carbide substrate according to claim 1, wherein the silicon carbide that forms the silicon carbide substrate is a hexagonal silicon carbide with its main surface formed as {0001} plane, and the incoherent boundary are formed in parallel to {11-20} plane or {-1100} plane.

9. A semiconductor device formed using the silicon carbide substrate of claim 1, wherein a silicon carbide layer having the same crystal structure as a structure of silicon carbide that forms the silicon carbide substrate, is formed on a surface of the silicon carbide substrate, and an internal electric field is formed on the silicon carbide layer.

* * * * *